US009166034B2

(12) United States Patent
Nam et al.

(10) Patent No.: US 9,166,034 B2
(45) Date of Patent: Oct. 20, 2015

(54) SEMICONDUCTOR DEVICES AND METHODS OF FABRICATING THE SAME

(71) Applicants: Ki-hyung Nam, Yongin-si (KR); Pulunsol Cho, Gwacheon-si (KR); Yong Kwan Kim, Yongin-si (KR)

(72) Inventors: Ki-hyung Nam, Yongin-si (KR); Pulunsol Cho, Gwacheon-si (KR); Yong Kwan Kim, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 13/948,629

(22) Filed: Jul. 23, 2013

(65) Prior Publication Data

US 2014/0054721 A1 Feb. 27, 2014

(30) Foreign Application Priority Data

Aug. 21, 2012 (KR) .................. 10-2012-0091485

(51) Int. Cl.
*H01L 27/088* (2006.01)
*H01L 29/78* (2006.01)
*H01L 29/423* (2006.01)
(Continued)

(52) U.S. Cl.
CPC ............. *H01L 29/78* (2013.01); *H01L 27/228* (2013.01); *H01L 27/2454* (2013.01); *H01L 27/2463* (2013.01); *H01L 29/4236* (2013.01); *H01L 29/66621* (2013.01); *H01L 27/10876* (2013.01); *H01L 27/10888* (2013.01); *H01L 27/10891* (2013.01); *H01L 45/04* (2013.01); *H01L 45/06* (2013.01); *H01L 45/1233* (2013.01); *H01L 45/143* (2013.01); *H01L 45/144* (2013.01); *H01L 45/146* (2013.01); *H01L 45/147* (2013.01); *H01L 45/148* (2013.01)

(58) Field of Classification Search
CPC ................ H01L 29/78; H01L 29/4236; H01L 29/66621; H01L 27/228; H01L 27/2454; H01L 27/2463; H01L 27/10876; H01L 27/10888; H01L 27/10891; H01L 45/04; H01L 45/06; H01L 45/1233; H01L 45/143; H01L 45/144; H01L 45/146; H01L 45/147; H01L 45/148
USPC ......................................................... 257/401
See application file for complete search history.

(56) References Cited

U.S. PATENT DOCUMENTS

| 6,171,916 B1 | 1/2001 | Sugawara et al. |
| 6,642,130 B2 | 11/2003 | Park |

(Continued)

FOREIGN PATENT DOCUMENTS

| JP | 2003-158201 A | 5/2003 |
| JP | 2004-119616 A | 4/2004 |

(Continued)

*Primary Examiner* — Victor A Mandala
(74) *Attorney, Agent, or Firm* — Harness, Dickey & Pierce, P.L.C.

(57) ABSTRACT

A semiconductor device, and a method of fabricating the same, include a substrate including two-dimensionally arranged active portions, device isolation patterns extending along sidewalls of the active portions, each of the device isolation patterns including first and second device isolation patterns, gate patterns extending across the active portions and the device isolation patterns, each of the gate patterns including a gate insulating layer, a gate line and a gate capping pattern, and ohmic patterns on the active portions, respectively. Top surfaces of the first device isolation pattern and the gate insulating layer may be lower than those of the second device isolation pattern and the gate capping pattern, respectively, and the ohmic patterns may include an extending portion on the first insulating layer.

17 Claims, 38 Drawing Sheets

(51) Int. Cl.
  *H01L 29/66* (2006.01)
  *H01L 27/22* (2006.01)
  *H01L 27/24* (2006.01)
  *H01L 27/108* (2006.01)
  *H01L 45/00* (2006.01)

(56) References Cited

U.S. PATENT DOCUMENTS

| | | | |
|---|---|---|---|
| 7,402,863 | B2 | 7/2008 | Jones |
| 8,105,905 | B2 | 1/2012 | Hu et al. |
| 2003/0119264 | A1 | 6/2003 | Park |
| 2005/0280079 | A1 | 12/2005 | Jones |
| 2007/0164353 | A1 | 7/2007 | Mifuji et al. |
| 2008/0224232 | A1 | 9/2008 | Hsieh et al. |
| 2009/0233439 | A1 | 9/2009 | Park et al. |
| 2009/0321820 | A1 | 12/2009 | Yamakawa |
| 2010/0084713 | A1 | 4/2010 | Nakagawa et al. |
| 2010/0232200 | A1* | 9/2010 | Shepard ............ 365/51 |
| 2010/0240184 | A1* | 9/2010 | Jung et al. ........ 438/270 |
| 2011/0124167 | A1 | 5/2011 | Hu et al. |
| 2011/0303991 | A1 | 12/2011 | Masuoka et al. |
| 2012/0112270 | A1* | 5/2012 | Park et al. ........ 257/330 |

FOREIGN PATENT DOCUMENTS

| | | |
|---|---|---|
| JP | 2005150565 A | 6/2005 |
| KR | 10-0605908 B1 | 8/2006 |

* cited by examiner

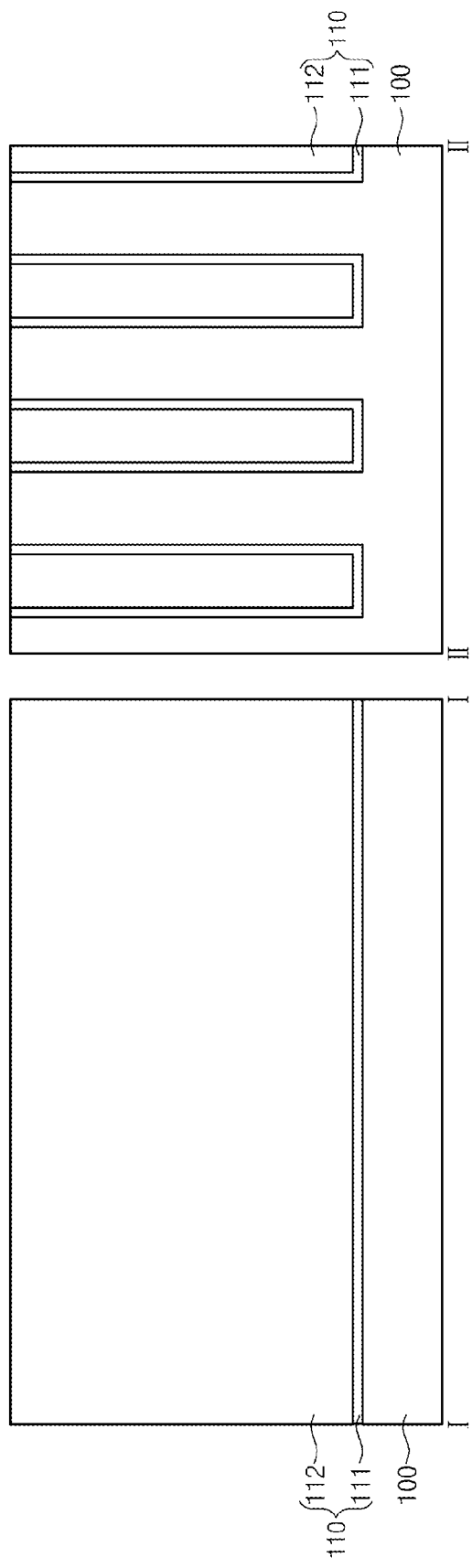

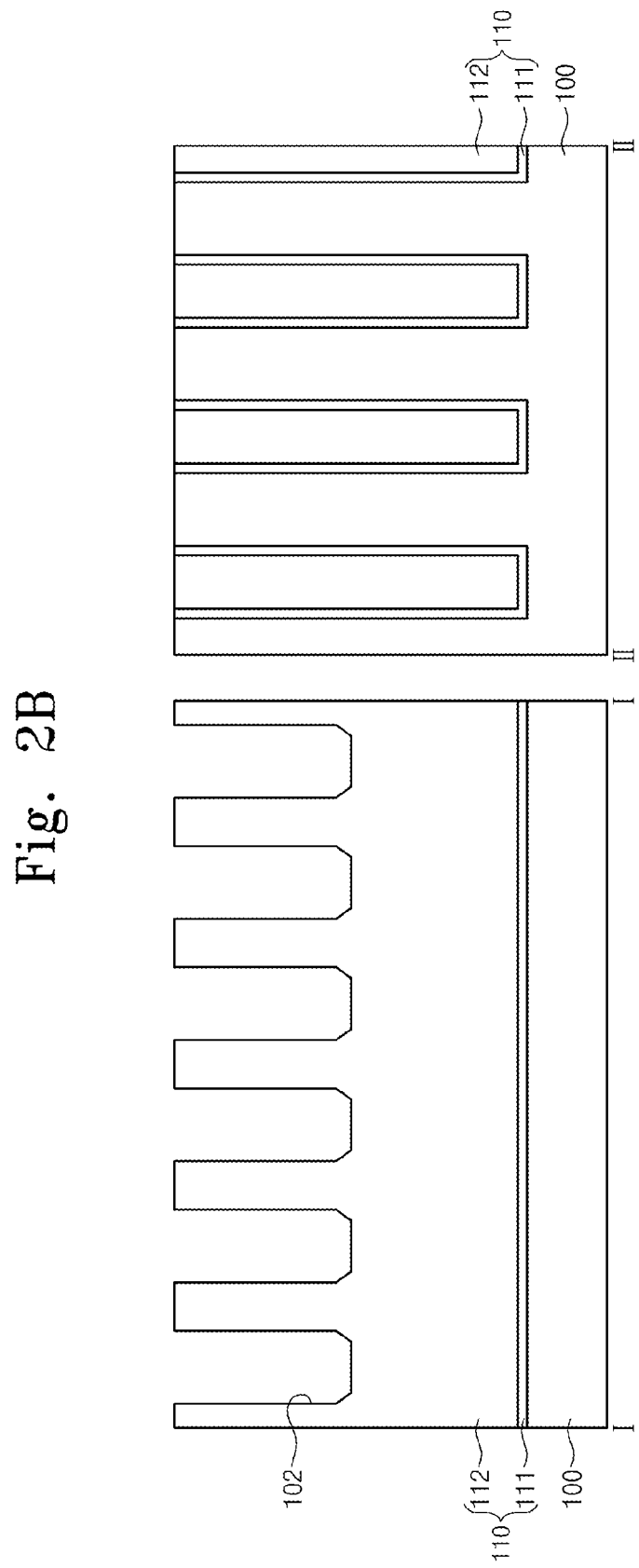

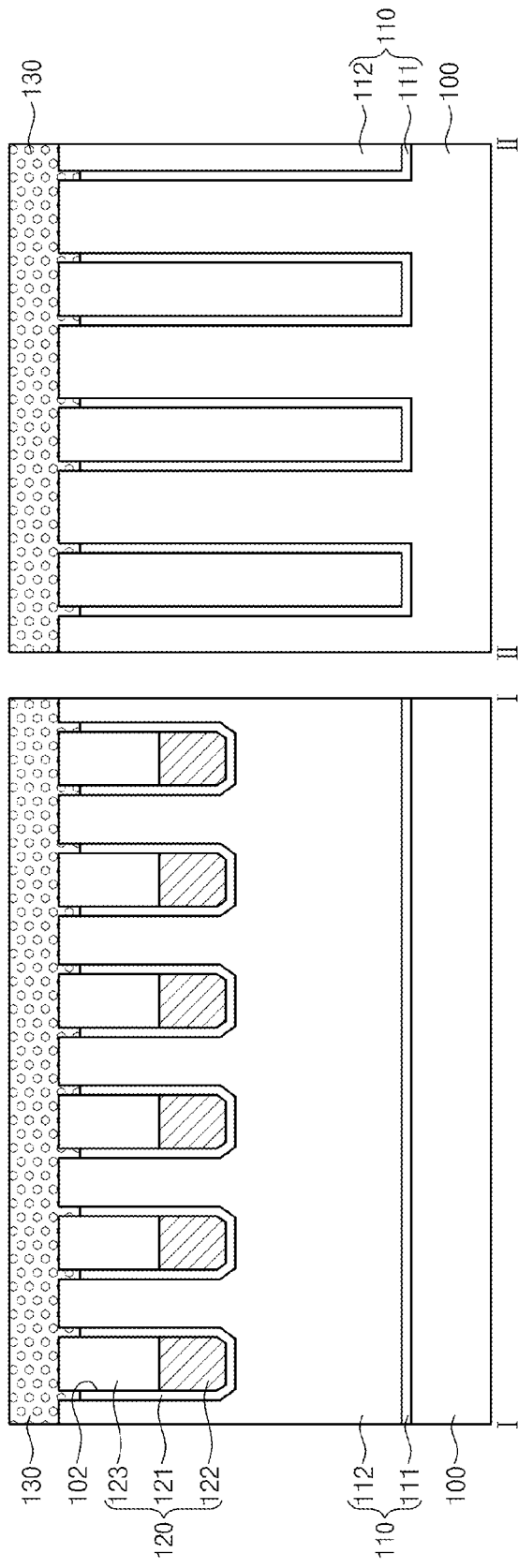

SEMICONDUCTOR DEVICES AND METHODS OF FABRICATING THE SAME

CROSS-REFERENCE TO RELATED APPLICATIONS

This U.S. non-provisional patent application claims the benefit of priority under 35 U.S.C. §119 to Korean Patent Application No. 10-2012-0091485, filed on Aug. 21, 2012, in the Korean Intellectual Property Office, the entire contents of which are hereby incorporated by reference.

BACKGROUND

1. Field

Example embodiments relate to a semiconductor device and/or a method of fabricating the same, and in particular, example embodiments relate to a semiconductor device having an ohmic pattern and/or a method of fabricating the same.

2. Description of Related Art

To meet a growing demand for lightweight, small-sized, high-speed, multifunctional, high-performance, high-reliable, and low-cost electronic devices, it is necessary for a semiconductor memory device to have a high integration density and good reliability.

An increase in integration density of a semiconductor device can be achieved by reducing a line width of components constituting the semiconductor device. However, this line width reduction may result in an increase in contact resistance between a metal pattern and a semiconductor pattern. The contact resistance may be reduced by forming an ohmic pattern between the metal pattern and the semiconductor pattern.

SUMMARY

Example embodiments relate to a semiconductor device and/or a method of fabricating the same, and in particular, example embodiments relate to a semiconductor device having an ohmic pattern and/or a method of fabricating the same.

Example embodiments provide semiconductor devices configured to reduce a contact resistance between a metal pattern and a semiconductor pattern.

Other example embodiments provide semiconductor devices configured to prevent an electric short between adjacent ohmic patterns from occurring.

Still other example embodiments provide methods of fabricating a semiconductor device configured to reduce a contact resistance between a metal pattern and a semiconductor pattern.

Even other example embodiments provide methods of fabricating a semiconductor device configured to prevent an electric short between adjacent ohmic patterns from occurring.

According to example embodiments, a semiconductor device include a substrate including a plurality of active portions delimited by a plurality of first trenches and a plurality of second trenches, a plurality of device isolation patterns in the plurality of first trenches and extending along sidewalls of the plurality of active portions, a plurality of gate patterns in the plurality of second trenches and extending across the plurality of active portions and the plurality of device isolation patterns, a plurality of ohmic patterns on the plurality of active portions, respectively, and a plurality of metal patterns coupled to the plurality of ohmic patterns. Each of the plurality of ohmic patterns has a portion having a width greater than a width of a corresponding one of the plurality of active portions thereunder, when measured in a direction parallel to the plurality first and second trenches.

In example embodiments, each of the plurality of device isolation patterns may include a first device isolation pattern and a second device isolation pattern sequentially stacked on an inner surface of a corresponding one of the plurality of first trenches, and the first device isolation pattern has a top surface lower than a top surface of the second device isolation pattern, thereby exposing an upper side surface of the second device isolation pattern.

In example embodiments, the plurality of ohmic patterns may be in contact with at least one of the top surface of the first device isolation pattern or the exposed upper side surface of the second device isolation pattern.

In example embodiments, each of the plurality of gate patterns may include a gate insulating layer covering an inner surface of a corresponding one of the plurality of second trenches, a gate line filling a lower region of the corresponding one of the plurality of second trenches covered by the gate insulating layer, and a gate capping pattern filling an upper region of the corresponding one of the plurality of second trenches covered by the gate insulating layer. The gate insulating layer has a top surface lower than a top surface of the gate capping pattern, thereby exposing an upper side surface of the gate capping pattern.

In example embodiments, the gate insulating layer may be formed within a localized region between facing surfaces of the substrate and the gate line, and the gate line may be in contact with the plurality of device isolation patterns.

In example embodiments, the plurality of ohmic patterns may be in contact with at least one of the top surface of the gate insulating layer or the exposed upper side surface of the gate capping pattern.

In example embodiments, a bottom surface of the plurality ohmic patterns may be lower than the top surface of the gate insulating layer.

In example embodiments, each of the plurality of device isolation patterns and each of the plurality of gate patterns may include a first insulating layer in contact with the corresponding one of the active portions, the first insulating layer being made of one selected from silicon oxide and metal oxides, and a second insulating layer spaced apart from the corresponding one of the plurality of active portions, the second insulating layer being made of one of silicon nitride and silicon oxynitride. The first insulating layer has a top surface lower than a top surface of the second insulating layer, and a corresponding one of the ohmic patterns may include an extending portion on the first insulating layer.

According to example embodiments, a method of fabricating a semiconductor device may include patterning a substrate to form a plurality of first trenches defining a plurality of line patterns, forming a plurality of device isolation patterns in the plurality of first trenches, each of the plurality of device isolation patterns including a first device isolation pattern and a second device isolation pattern, patterning the plurality of line patterns and the plurality of device isolation patterns so as to form a plurality of second trenches extending across the plurality of first trenches and so as to define a plurality of active portions, forming a plurality of gate patterns in the plurality of second trenches, each of the plurality of gate patterns including a gate insulating layer, a gate line and a gate capping pattern, recessing at least one of the first device isolation pattern and the gate insulating layer so as to expose upper side surfaces of the plurality of active portions, forming a metal layer covering the exposed upper side surfaces of the plurality of active portions, and reacting the metal layer with the substrate to form a plurality of ohmic patterns on the plurality of active portions.

In example embodiments, the first device isolation pattern may be formed of silicon oxide, the gate insulating layer may be formed of one selected from silicon oxide and metal oxides, the second device isolation pattern may be formed of one selected from silicon nitride and silicon oxynitride, and the gate capping pattern may be formed of one selected from silicon nitride and silicon oxynitride.

In example embodiments, the method may further include performing a pre-treatment process so as to change a crystal structure of the plurality of active portions into an amorphous state, prior to the forming of the metal layer.

According to example embodiments, a semiconductor device may include a substrate including a plurality of two-dimensionally arranged active portions, a plurality of device isolation patterns extending along sidewalls of the plurality of two-dimensionally arranged active portions, each of the plurality of device isolation patterns including a first device isolation pattern and a second device isolation pattern, a plurality of gate patterns extending across the plurality of two-dimensionally arranged active portions and the plurality of device isolation patterns, each of the plurality of gate patterns including a gate insulating layer, a gate line and a gate capping pattern, and a plurality of ohmic patterns on the plurality of two-dimensionally arranged active portions, respectively. A top surface of the first device isolation pattern and a top surface of the gate insulating layer may be lower than a top surface of the second device isolation pattern and a top surface of the gate capping pattern, respectively, and a corresponding one of the ohmic patterns may include an extending portion on the first insulating layer.

In example embodiments, the first device isolation pattern may be formed of silicon oxide, the gate insulating layer may be formed of one selected from silicon oxide and metal oxides, the second device isolation pattern may be formed of one selected from silicon nitride and silicon oxynitride, and the gate capping pattern may be formed of one selected from silicon nitride and silicon oxynitride.

In example embodiments, a bottom surface of each of the plurality of ohmic patterns may be lower than the top surface of the gate insulating layer.

In example embodiments, the gate insulating layer may be formed within a localized region between facing surfaces of the substrate and the gate line, and the gate line may be in contact with the plurality of device isolation patterns.

According to example embodiments, a semiconductor device including at least two active regions protruding from an upper surface of a substrate, the at least two active regions being spaced apart from each other by a first trench; a device isolation pattern partially filling the first trench and having a plurality of protrusions extending parallel to the at least two active regions, wherein the plurality of protrusions are spaced apart from each other by a second trench traversing the first trench; a gate pattern in the second trench and extending over the at least two active regions, wherein the plurality of protrusions each have an upper portion spaced apart from the at least two active regions and exposed by the gate pattern; and a plurality of ohmic patterns each contacting an upper surface of a corresponding one of the at least two active regions.

The plurality of ohmic patterns may each have an upper portion having a width larger than a width of a lower portion of the plurality of ohmic patterns.

The upper portion of the plurality of ohmic patterns may contact a sidewall of the upper portion of the plurality of protrusions.

The plurality of ohmic patterns may be formed of a transition metal silicide selected from cobalt silicide, nickel silicide and titanium silicide.

The first trench may be entirely filled in, collectively, by the device isolation pattern and a corresponding one of the plurality of ohmic patterns.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 1A through 10A are perspective views illustrating a method of fabricating a semiconductor device according to example embodiments.

FIGS. 1B through 10B are sectional views taken along dotted lines I-I and II-II of FIGS. 1A through 10A, respectively.

FIGS. 1C through 10C are sectional views taken along dotted lines III-III and IV-IV of FIGS. 1A through 10A, respectively.

Figure 1A:
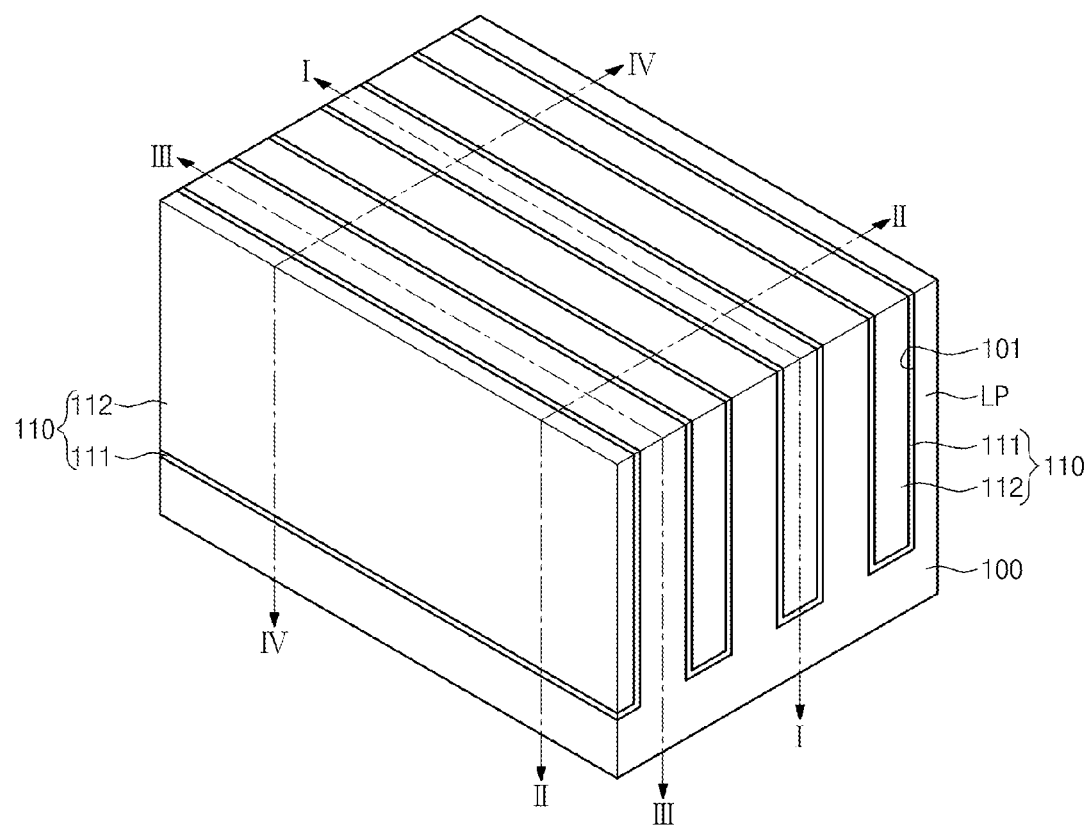

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Example embodiments relate to a semiconductor device and/or a method of fabricating the same, and in particular, example embodiments relate to a semiconductor device having an ohmic pattern and/or a method of fabricating the same.

FIGS. 1A through 10A are perspective views illustrating a method of fabricating a semiconductor device according to example embodiments. FIGS. 1B through 10B are sectional views taken along dotted lines I-I and II-II of FIGS. 1A through 10A, respectively, and FIGS. 1C through 10C are sectional views taken along dotted lines III-III and IV-IV of FIGS. 1A through 10A, respectively.

Figure 1C:
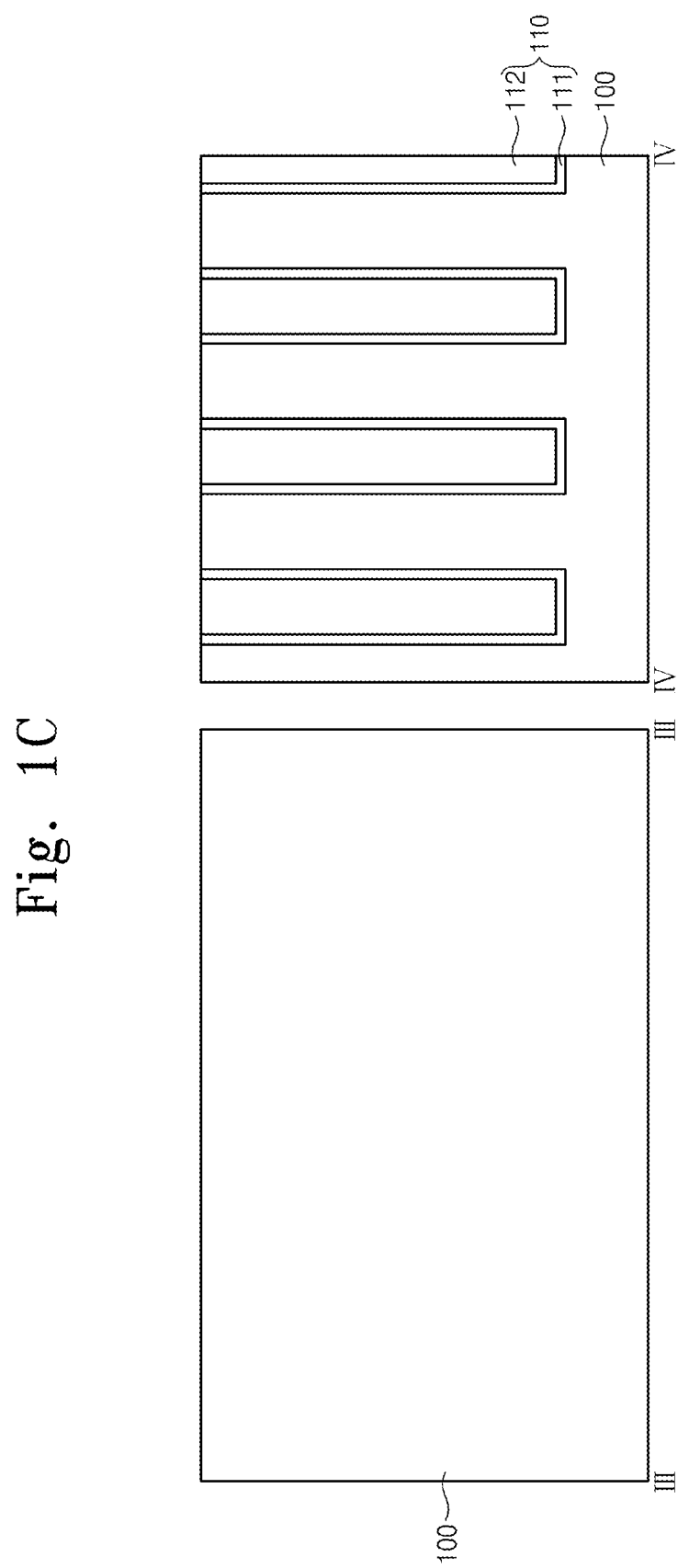

Referring to FIGS. 1A through 1C, a substrate 100 may be patterned to form first trenches 101, and device isolation patterns 110 may be formed to fill the first trenches 101.

The substrate 100 may be formed of a semiconductor material. For example, the substrate 100 may be a silicon wafer or a multilayered structure including at least one silicon layer. In example embodiments, the substrate 100 may include a well region doped with impurities.

The first trenches 101 may be formed parallel to each other. The formation of the first trenches 101 may include forming first mask patterns (not shown), which are parallel to each other, on the substrate 100, and then, anisotropically etching the substrate 100 using the first mask patterns as an etch mask. As the result of the formation of the first trenches 101, the substrate 100 may include line patterns LP, whose sidewalls are defined by the first trenches 101. In example embodiments, the first trenches 101 may be formed to have an aspect ratio (i.e., depth per width) of 10 or more. The first mask patterns may be removed after the formation of the first trenches 101 or the formation of the device isolation patterns 110.

The formation of the device isolation patterns 110 may include forming a device isolation layer to fill the first trenches 101, and then, localizing the device isolation layer into the first trenches 101. In example embodiments, the device isolation layer may include a first device isolation layer, which may conformally cover a resulting structure provided with the first trenches 101, and a second device isolation layer, which may fill the first trenches 101 provided with the first device isolation layer. In this case, each of the device isolation patterns 110 may include a first device isolation pattern 111 and a second device isolation pattern 112.

In example embodiments, the first device isolation layer or the first device isolation patterns 111 may be formed by thermally oxidizing inner surfaces of the first trenches 101. For example, the first device isolation patterns 111 may be formed of a silicon oxide layer. In other example embodiments, the first device isolation patterns 111 may be at least one of a silicon oxide layer or metal oxide layers, which may be formed by a chemical vapor deposition or an atomic layer deposition.

The second device isolation layer or the second device isolation patterns 112 may include at least one of materials having an etch selectivity with respect to the first device isolation layer. For example, in the case where the first device isolation patterns 111 are formed of the silicon oxide layer, the second device isolation patterns 112 may be one of a silicon nitride layer or a silicon oxynitride layer. The second device isolation layer may be formed by one of deposition techniques with excellent step coverage property. For example, the first trenches 101 provided with the first device isolation layer may be completely filled with the second device isolation layer.

In example embodiments, a seam may be formed in some or each of the second device isolation patterns 112. In addition, the second device isolation layer may be formed to have a deposition thickness greater than that of the first device isolation layer, and the first device isolation pattern 111 may have a horizontal thickness smaller than that of the second device isolation pattern 112.

Figure 2A:
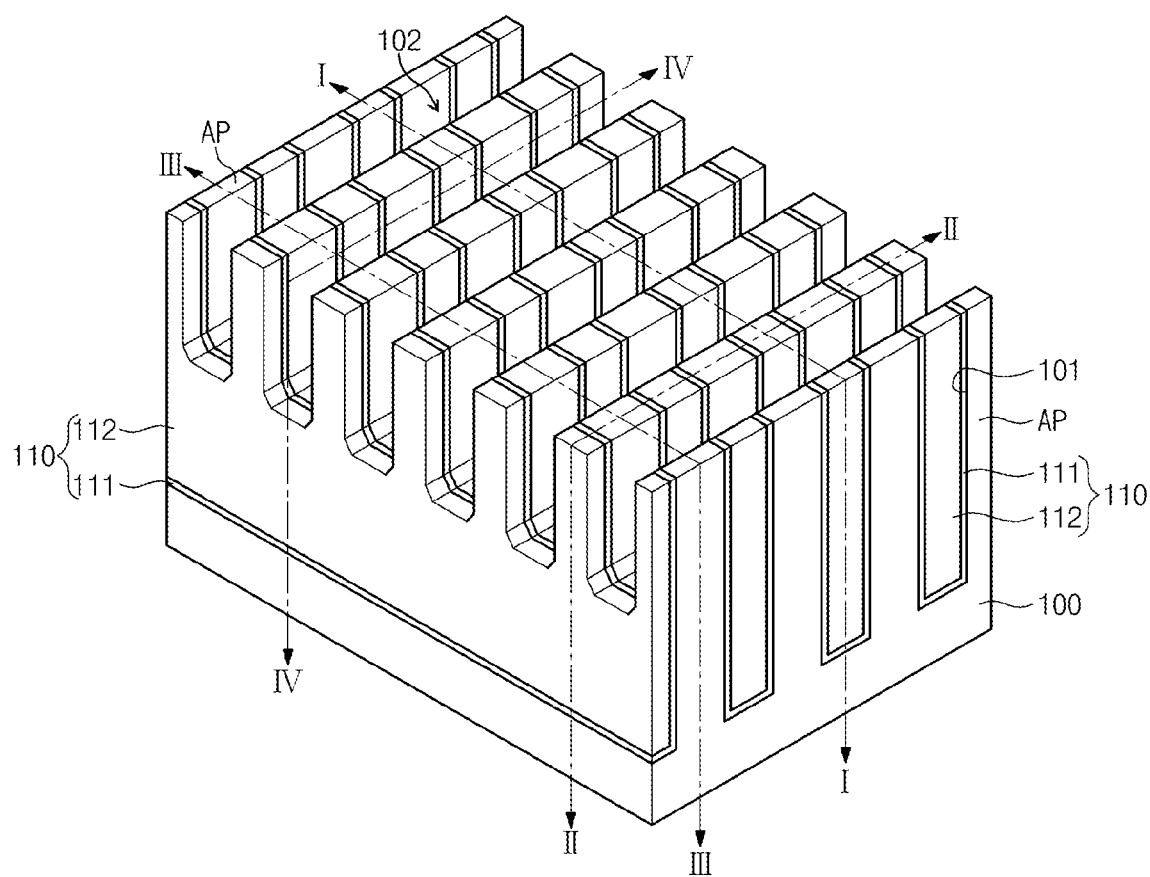
Figure 2C:
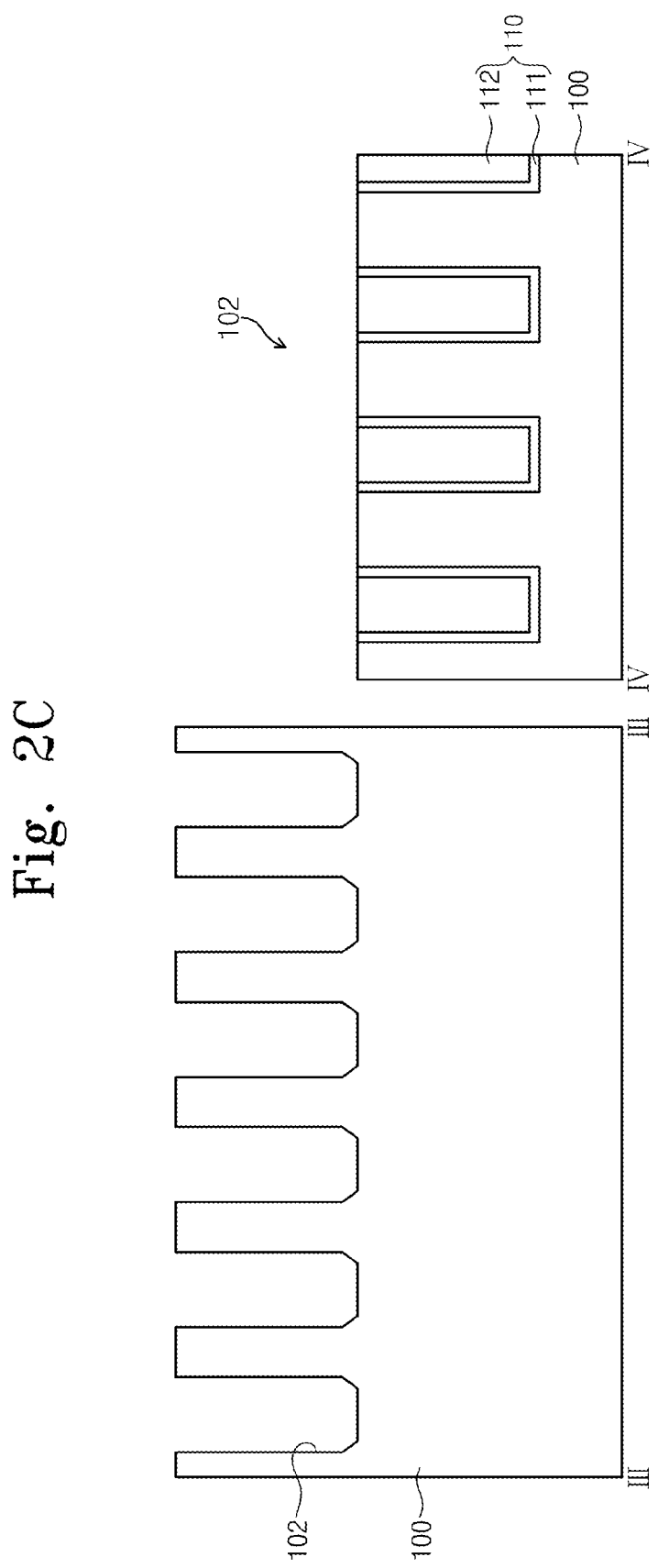

Referring to FIGS. 2A through 2C, the line patterns LP and the device isolation patterns 110 may be patterned to form second trenches 102. The second trenches 102 may be formed to cross the device isolation patterns 110. For example, the first and second trenches 101 and 102 may be formed to cross each other, and thus, the substrate 100 may have active portions AP delimited by the first and second trenches 101 and 102.

In each of the active portions AP, a pair of opposite sidewalls may be delimited by the first trenches 101, and other pair of opposite sidewalls may be delimited by the second trenches 102.

The second trenches 102 may be formed to be shallower than the first trenches 101. Accordingly, a portion of the device isolation pattern 110 may remain between bottom surfaces of the first and second trenches 101 and 102.

The formation of the second trenches 102 may include forming second mask patterns (not shown) to cross the device isolation patterns 110, and then, anisotropically etching the line patterns LP and the device isolation patterns 110 using the second mask patterns as an etch mask. In example embodiments, during the formation of the second trenches 102, the device isolation pattern 110 and the line pattern LP may be etched in etch rates different from each other. In this case, a bottom surface of the second trench 102 on the device isolation pattern 110 may be formed at a different level from that on the line pattern LP. The second mask patterns may be removed after the formation of the second trenches 102 or after a formation of gate patterns that will be described with reference to FIG. 3A.

Figure 3A:
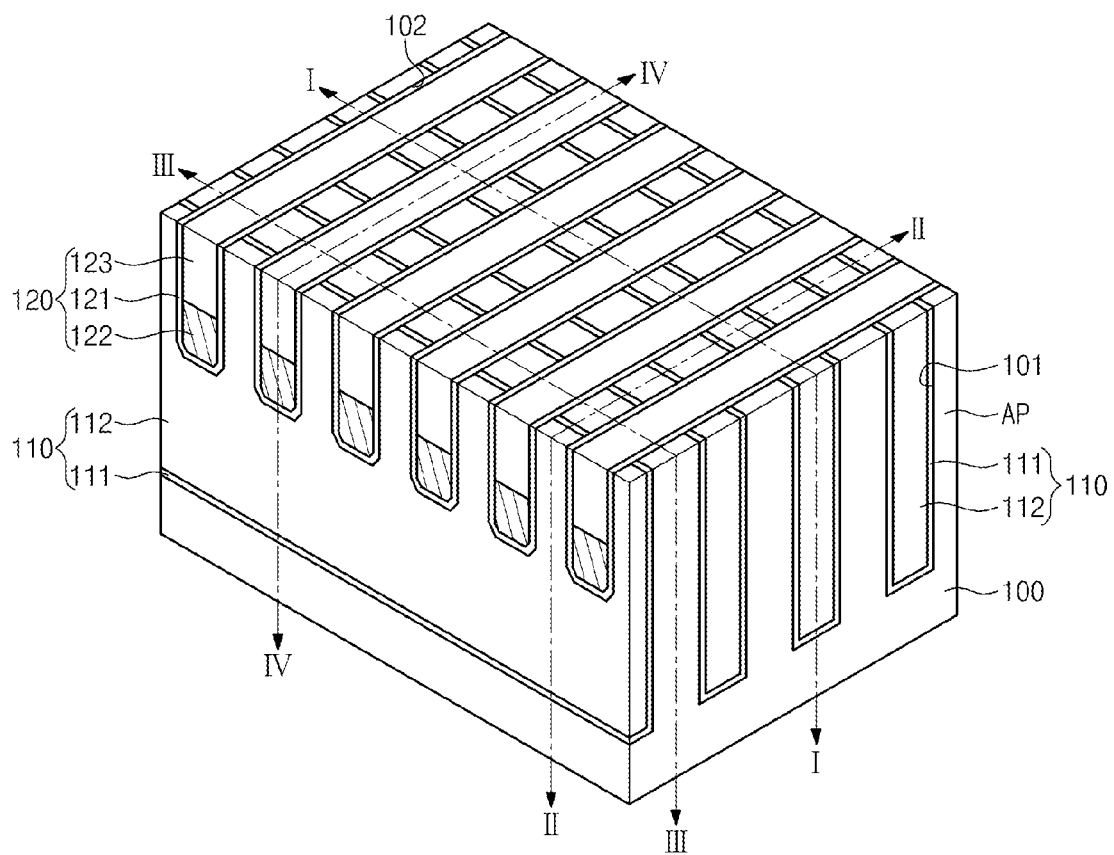
Figure 3B:
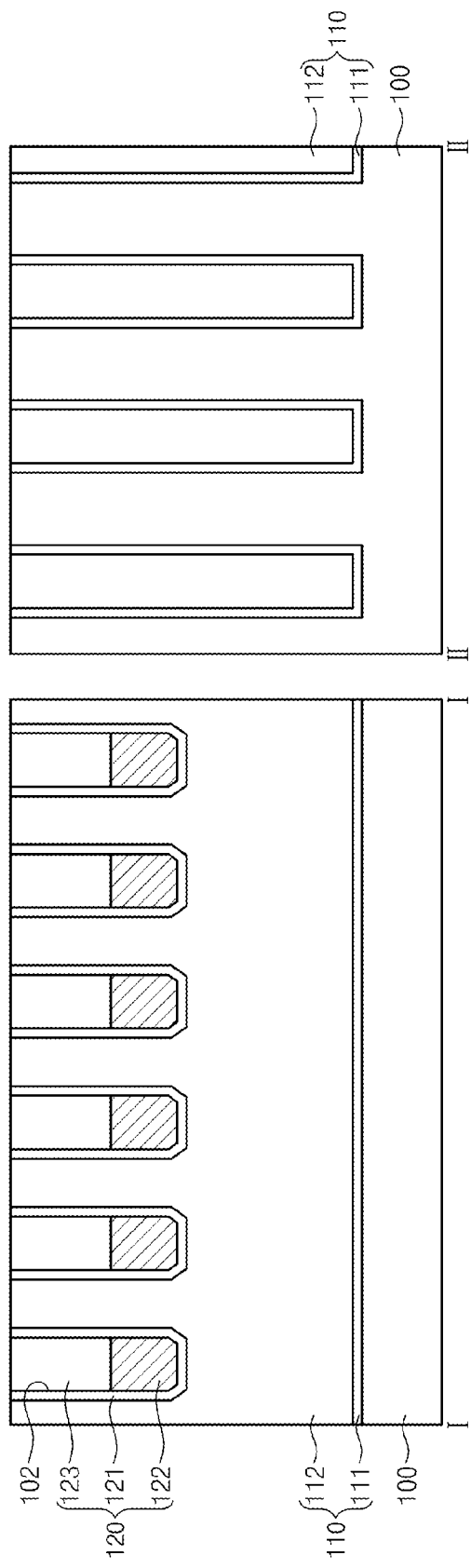
Figure 3C:
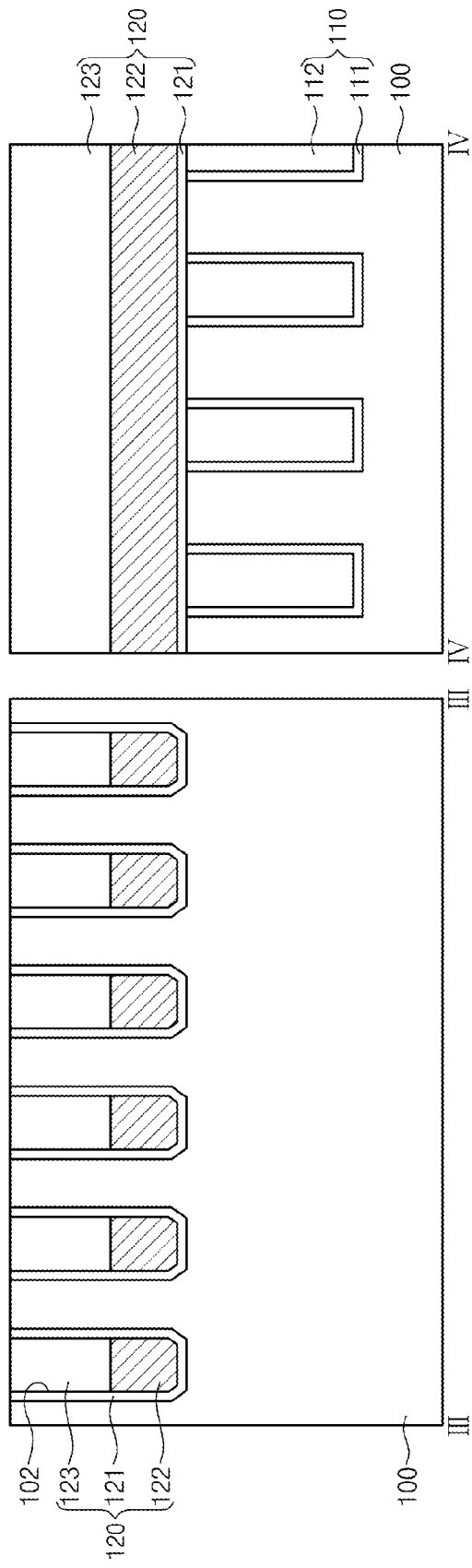

Referring to FIGS. 3A through 3C, gate patterns 120 may be formed to fill the second trenches 102. Each of the gate patterns 120 may include a gate insulating layer 121, a gate line 122 and a gate capping pattern 123. The gate insulating layer 121 may be formed to conformally cover the second trench 102, and the gate line 122 and the gate capping pattern 123 may fill the second trench 102 provided with the gate insulating layer 121, sequentially.

The gate insulating layer 121 may be formed of one of a silicon oxide layer or metal oxide layers (e.g., hafnium oxide and aluminum oxide), and the gate capping pattern 123 may include at least one of insulating materials having an etch selectivity with respect to the gate insulating layer 121. For example, in the case where the gate insulating layer 121 is formed of an oxide layer, the gate capping pattern 123 may be formed of one of nitride layers (e.g., a silicon nitride layer or a silicon oxynitride layer). The gate lines 122 may include at least one of doped semiconductor materials (e.g., doped silicon), metal materials (e.g., tungsten, aluminum, titanium, and tantalum), conductive metal nitrides (e.g., titanium nitride, tantalum nitride, and tungsten nitride), and metal-semiconductor compounds (e.g., metal silicide).

As shown, the gate insulating layer 121 may be formed to cover the whole inner surface of the second trench 102. In this case, the gate line 122 and the gate capping pattern 123 may be spatially and electrically separated from the active portions AP and the device isolation patterns 110 by the gate insulating layer 121.

Figure 4A:
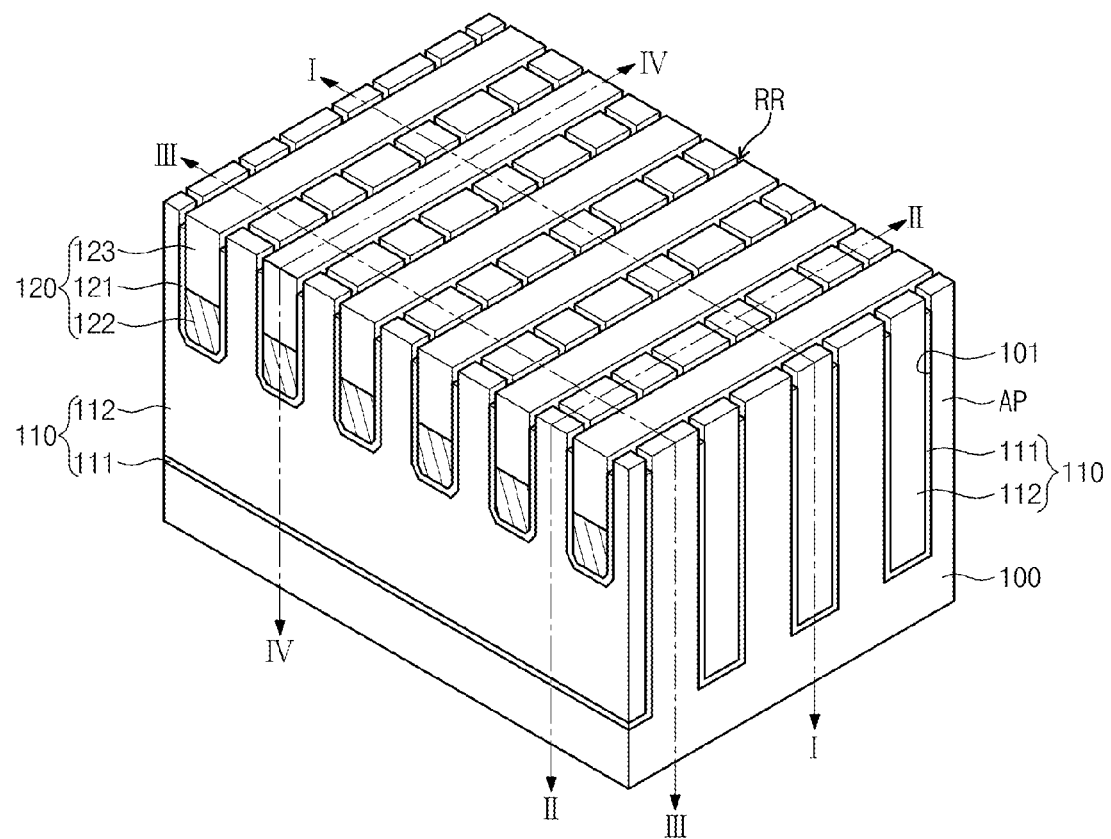
Figure 4B:
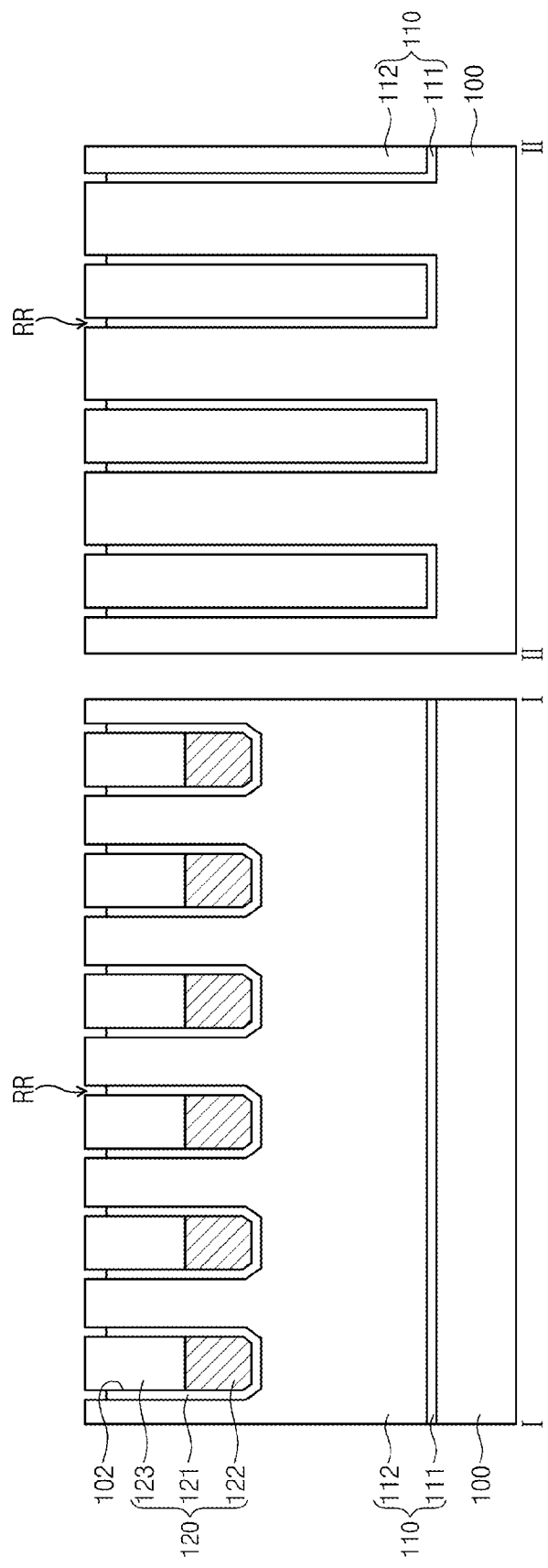
Figure 4C:
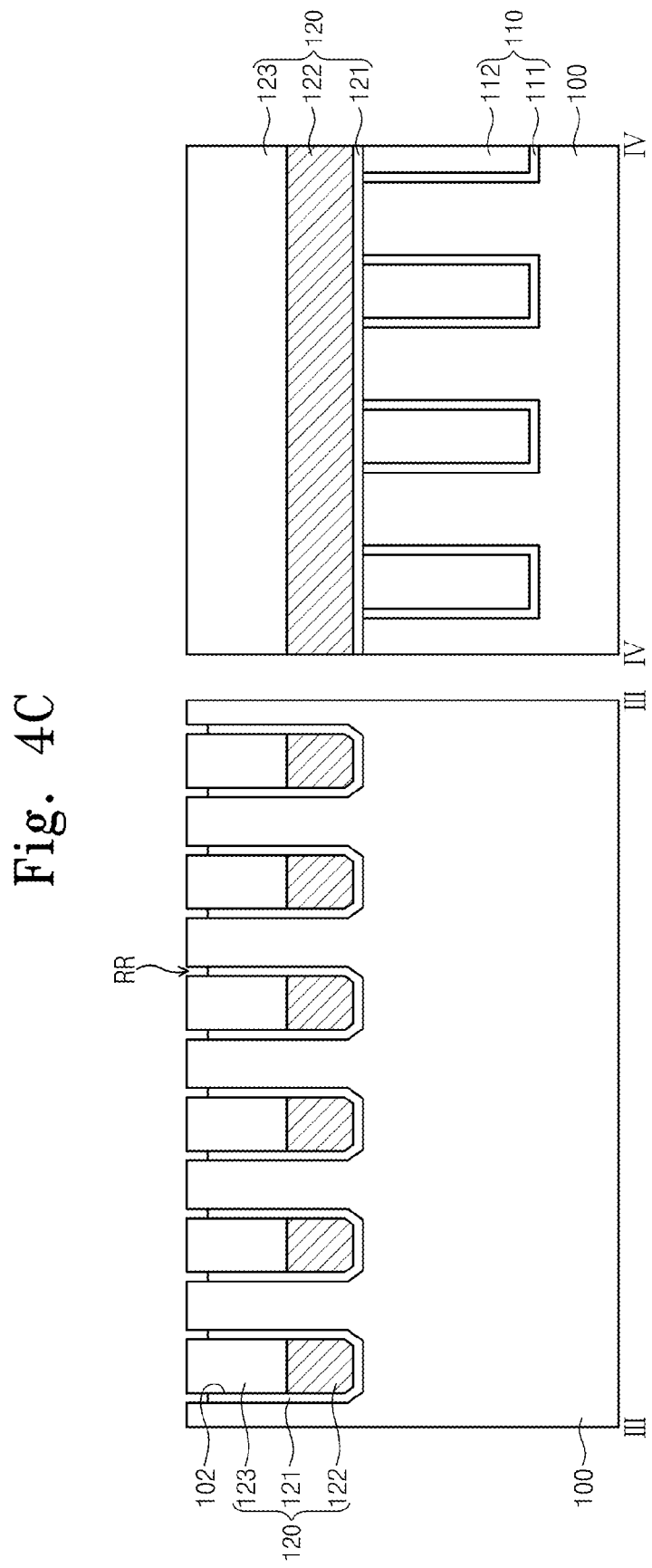

Referring to FIGS. 4A through 4C, an etching process may be performed to form recess regions RR exposing top surfaces and upper sidewalls of the active portions AP. For example, the formation of the recess regions RR may be performed to recess top surfaces of the gate insulating layers 121 and the first device isolation patterns 111. Each of the recess regions RR may have a bottom surface that is formed at a level higher than top surfaces of the gate lines 122 adjacent thereto.

According to some of the above-described example embodiments, the gate insulating layers 121 and the first device isolation patterns 111 may be formed of an oxide layer, and the gate capping patterns 123 and the second device isolation patterns 112 may be formed of a nitride layer. In this case, the formation of the recess regions RR may include selectively etching the gate insulating layers 121 and the first device isolation patterns 111 using an etch recipe with an etch selectivity with reference to the gate capping patterns 123 and the second device isolation patterns 112. For example, a wet etching process, in which hydrofluoric acid is used, may be performed to recess selectively the top surfaces of the gate insulating layers 121 and the first device isolation patterns 111.

Figure 5A:
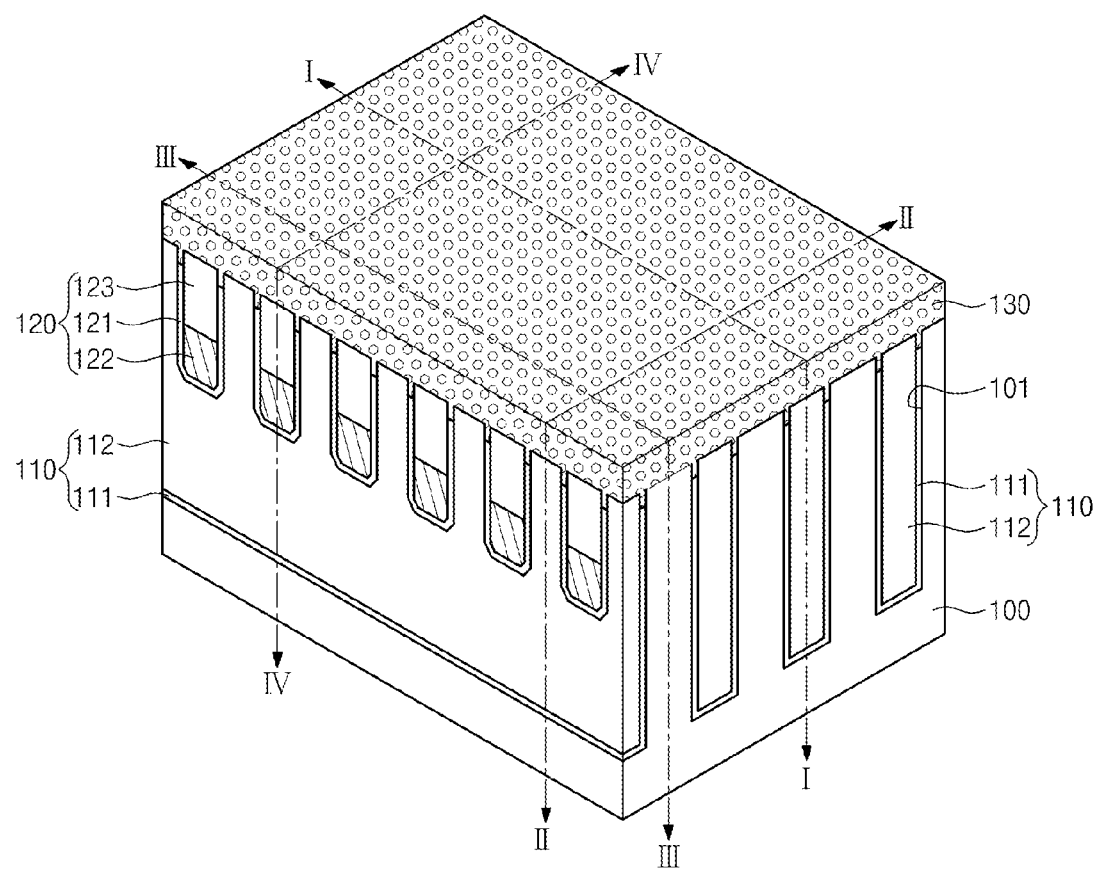
Figure 5C:
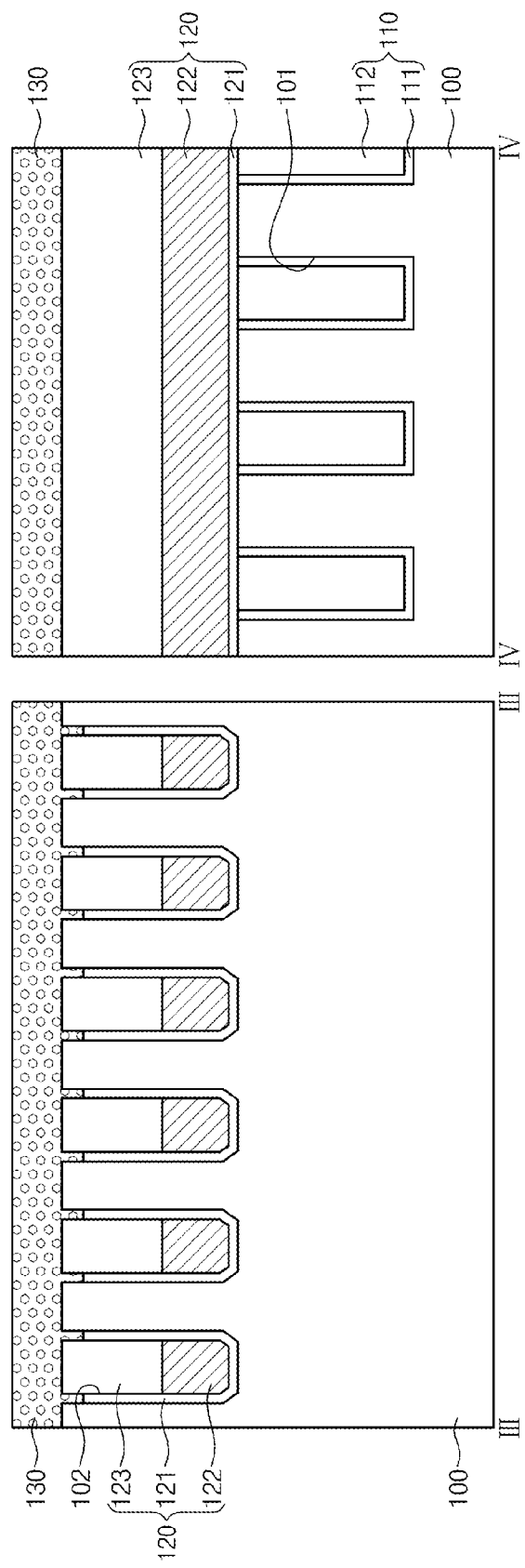

Referring to FIGS. 5A through 5C, a metal layer 130 may be formed on the resulting structure provided with the recess regions RR. The metal layer 130 may be formed of a metallic material, which can be reacted with a constituent material of the active portions AP to form a layer exhibiting an electrically ohmic property. For example, in the case where the substrate 100 is formed of silicon, metal layer 130 may be formed of one of cobalt, nickel and titanium.

In example embodiments, due to the presence of the recess regions RR, the metal layer 130 may be formed to cover not only a top surface but also upper sidewalls of each of the active portions AP. Accordingly, a surface area of the active portion AP being in contact with the metal layer 130 can be increased, compared with the absence of the recess region RR.

In example embodiments, an ion implantation process may be further performed to upper regions of the active portions AP, before the formation of the metal layer 130. As the result of the ion implantation process, the upper regions of the active portions AP may be doped to have a different conductivity type from that of the substrate 100 or the well region. The doped regions may be used for source or drain electrodes of transistors.

In example embodiments, a pre-treatment process may be further performed to the upper regions of the active portions AP, before the formation of the metal layer 130. The pre-treatment process may be performed to enhance a reaction between the metal layer 130 and the active portions AP. For example, because the active portions AP are portions of the substrate 100 delimited by the first and second trenches 101 and 102, they have the same material and the same crystal structure as the substrate 100. In other words, in the case where the substrate 100 is a silicon wafer, the active portions AP may be formed of a single crystalline silicon layer. The pre-treatment process may be performed to change the crystal structure of the active portions AP into an amorphous state. For example, the pre-treatment process may include injecting ions into the upper regions of the active portions AP, but example embodiments are not be limited thereto.

Figure 6A:
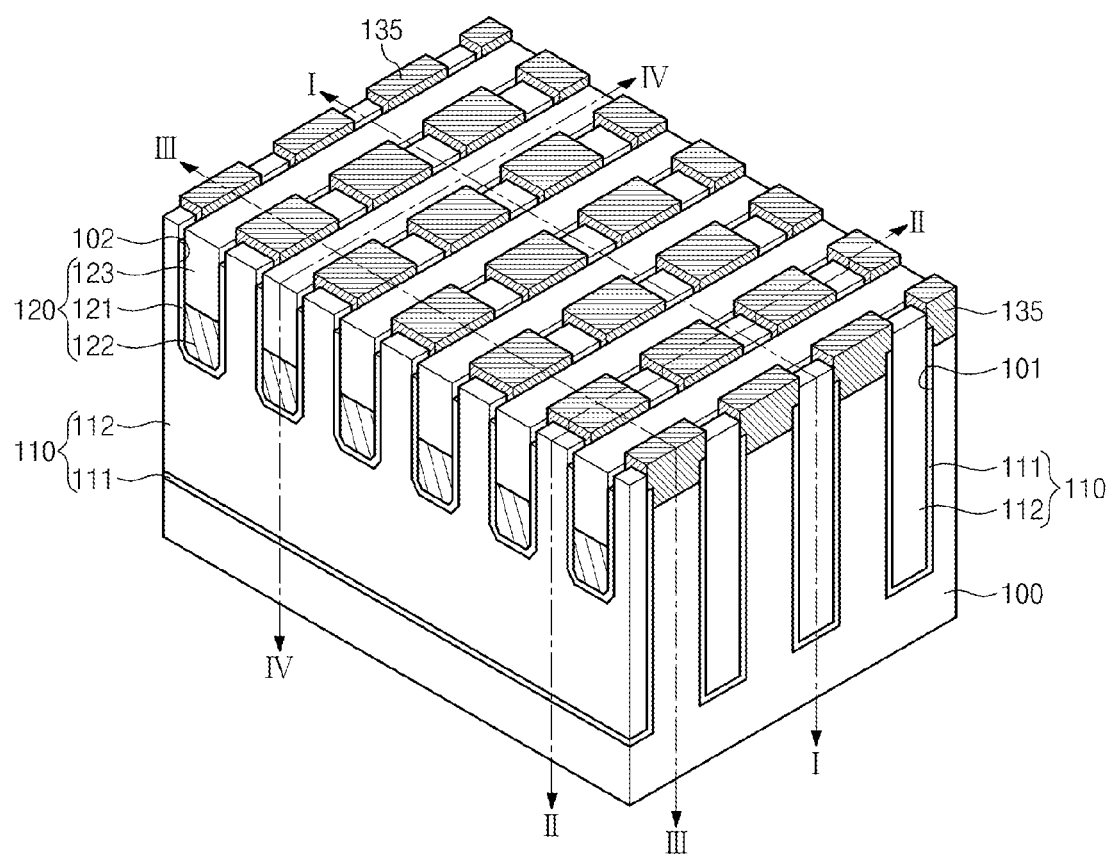
Figure 6B:
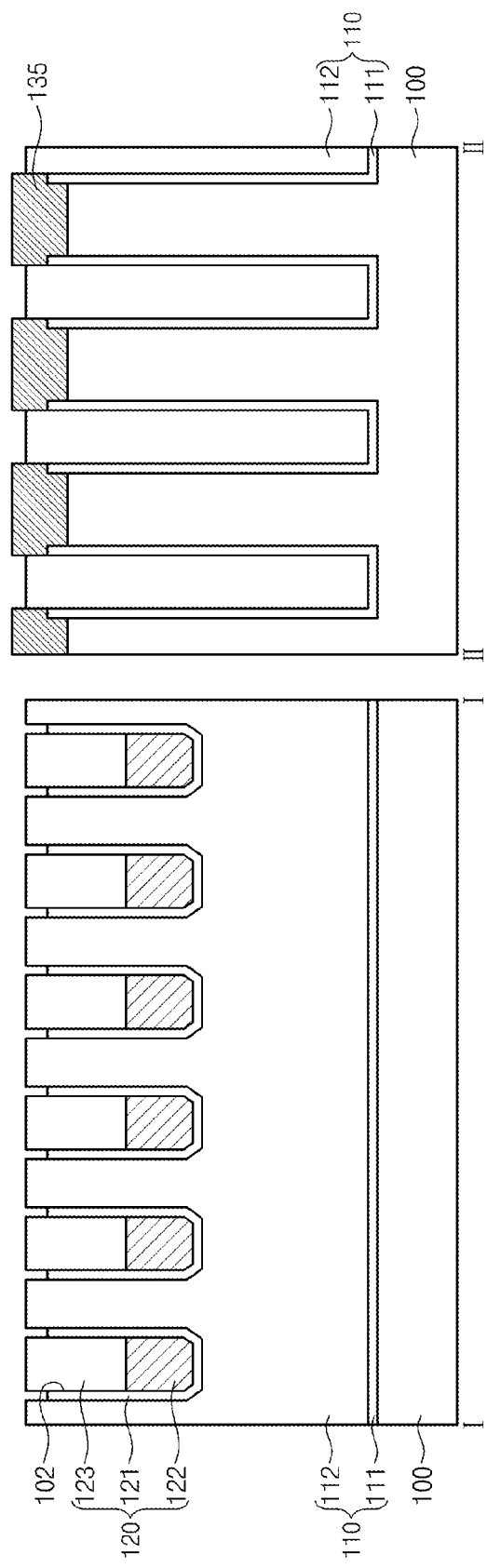
Figure 6C:
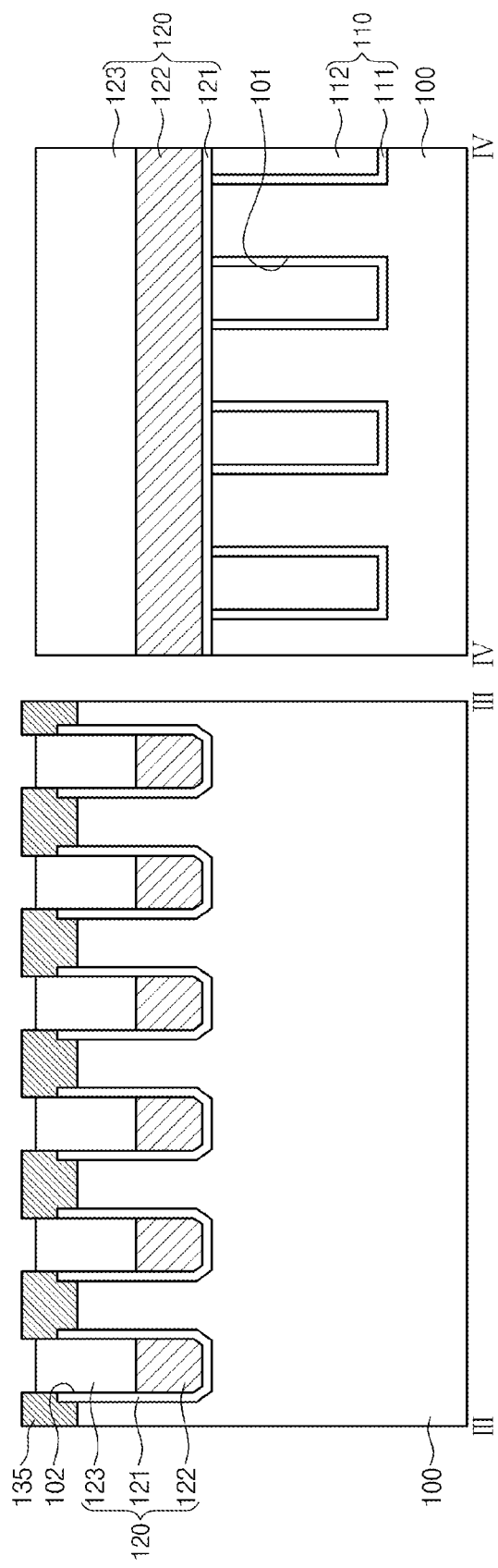

Referring to FIGS. 6A through 6C, ohmic patterns 135 may be formed on the active portions AP. The ohmic patterns 135 may result from a reaction between the metal layer 130 and the exposed portions of the active portions AP. For example, in the case where the active portions AP are formed of silicon, the ohmic patterns 135 may be formed using a silicidation technique. In other words, the ohmic patterns 135 may be formed of, for example, one of cobalt silicide, nickel silicide and titanium silicide.

The formation of the ohmic patterns 135 may include performing a thermal treatment to the structure provided with the metal layer 130 and removing a portion of the metal layer 130 that is not reacted with the active portions AP. In example embodiments, the thermal treatment may be performed in a manner of rapid thermal treatment. Further, the formation of the metal layer 130 and the thermal treatment may be performed in an in-situ manner. The non-reacted portion of the metal layer may be removed using an etch recipe having an etch selectivity with respect to the ohmic patterns 135, the gate capping patterns 123 and the second device isolation patterns 112.

Figure 7A:
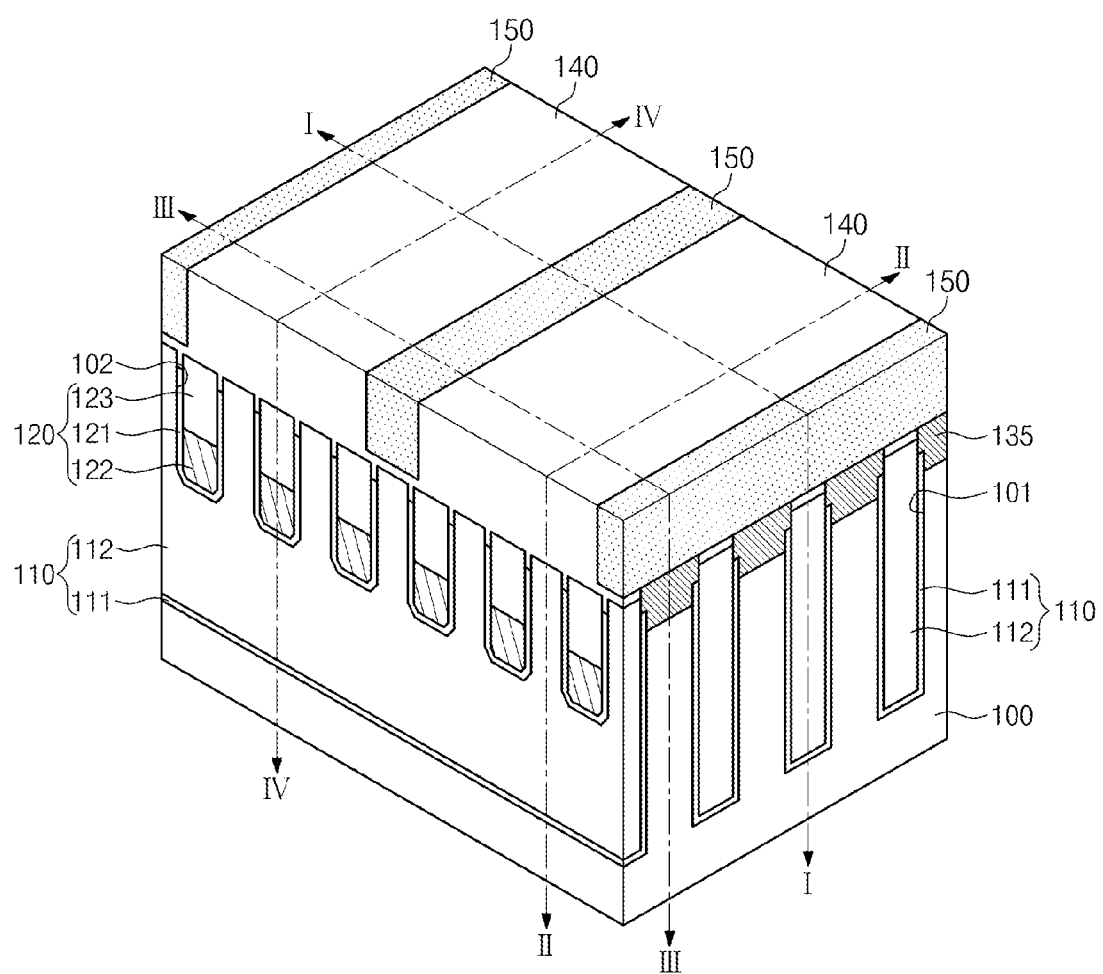
Figure 7B:
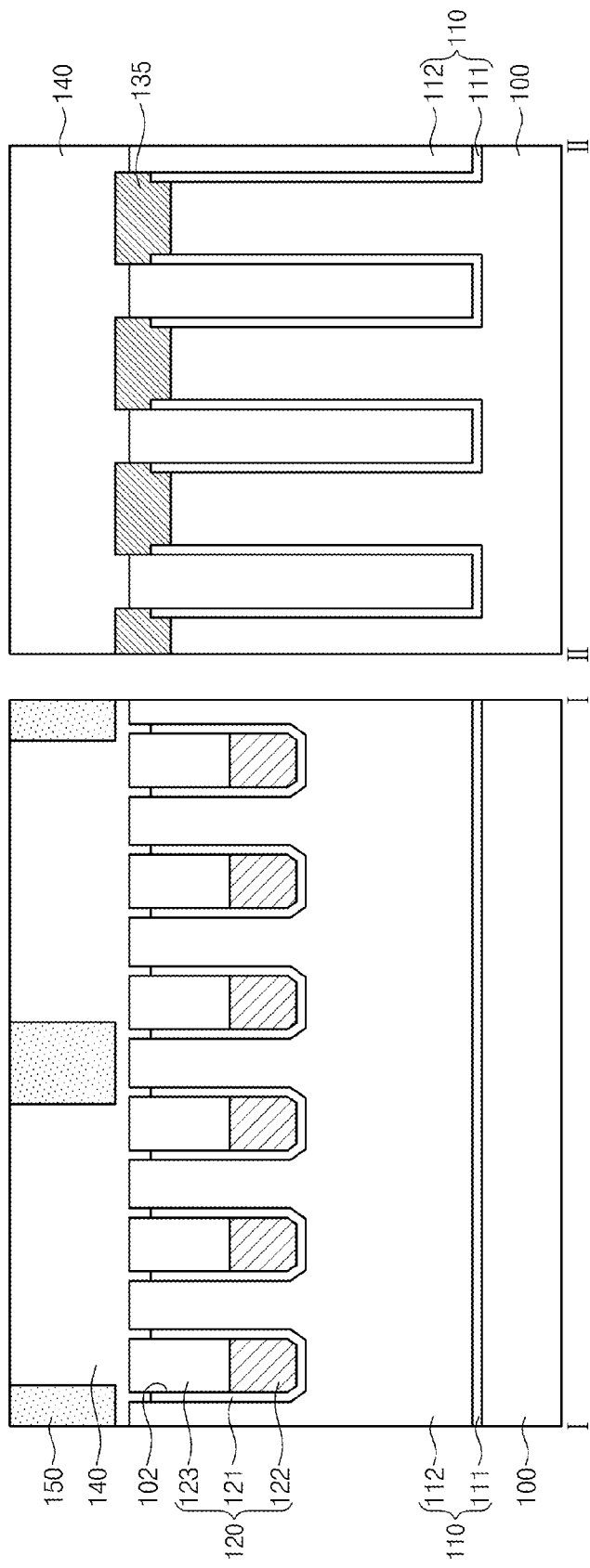
Figure 7C:
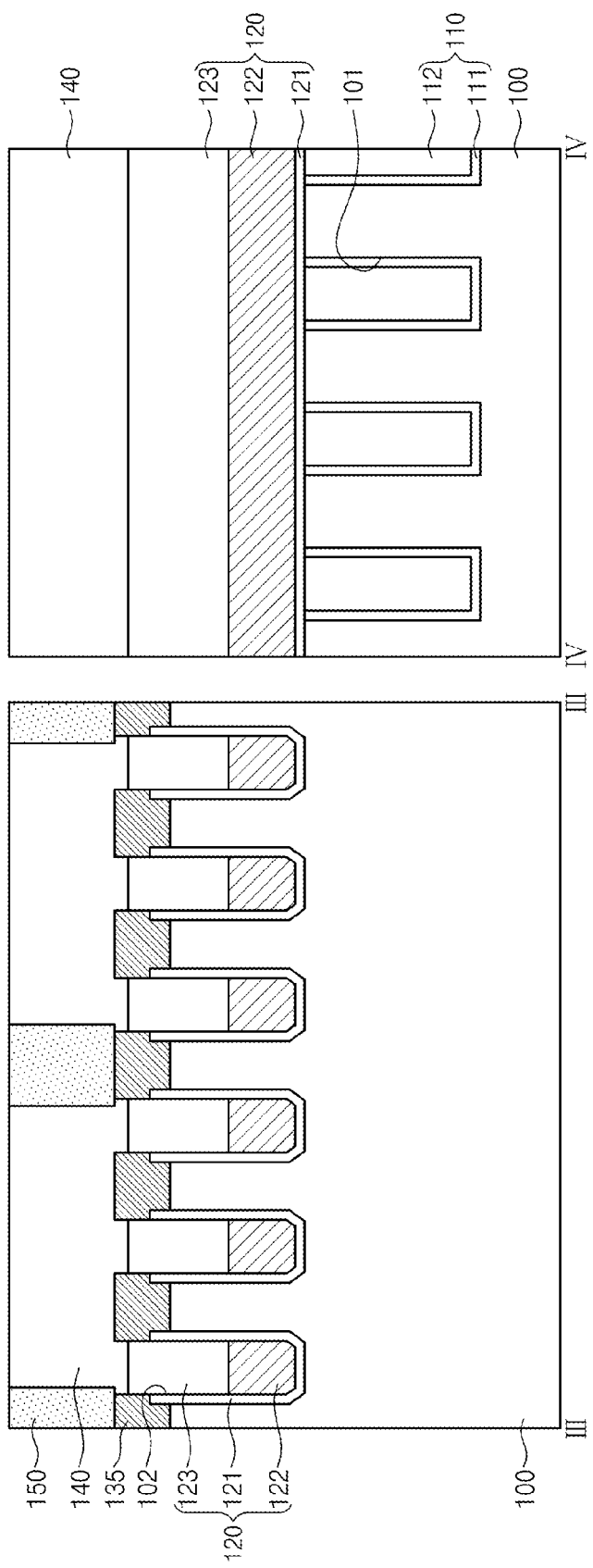

Referring to FIGS. 7A through 7C, source lines 150 may be formed to connect the ohmic patterns 135 to each other. Each of the source lines 150 may be a multi-layered structure including a transition metal layer and/or a transition metal nitride layer.

The source lines 150 may be formed to cross the device isolation patterns 110. The source lines 150 may be formed in such a way that at least three second trenches 102 may be disposed between an adjacent pair of the source lines 150. In other words, two columns of the active portions AP that are not connected to the source lines 150 may be interposed between the adjacent pair of the source lines 150, and they may serve as the source electrodes of transistors.

In example embodiments, the source lines 150 may be formed using a damascene process. For example, the formation of the source lines 150 may include forming a first interlayered insulating layer 140 on the structure provided with the ohmic patterns 135, patterning the first interlayered insulating layer 140 to form source trenches, and then, forming a metal layer to fill the source trenches. Each of the source trenches may be formed to cross the device isolation patterns 110 and expose more than one of the ohmic patterns 135. Accordingly, each of the source lines 150 may be connected in common to more than one of the ohmic patterns 135.

In other example embodiments, the source lines 150 may be formed using a patterning process. For example, the formation of the source lines 150 may include forming a conductive layer (not shown) on the structure provided with the ohmic patterns 135, patterning the conductive layer to form the source lines 150, and then, forming the first interlayered insulating layer 140 on the source lines 150. In this case, unlike shown in FIGS. 7A through 7C, the source lines 150 may be formed to be in direct contact with top surfaces of the device isolation patterns 110.

Figure 8A:
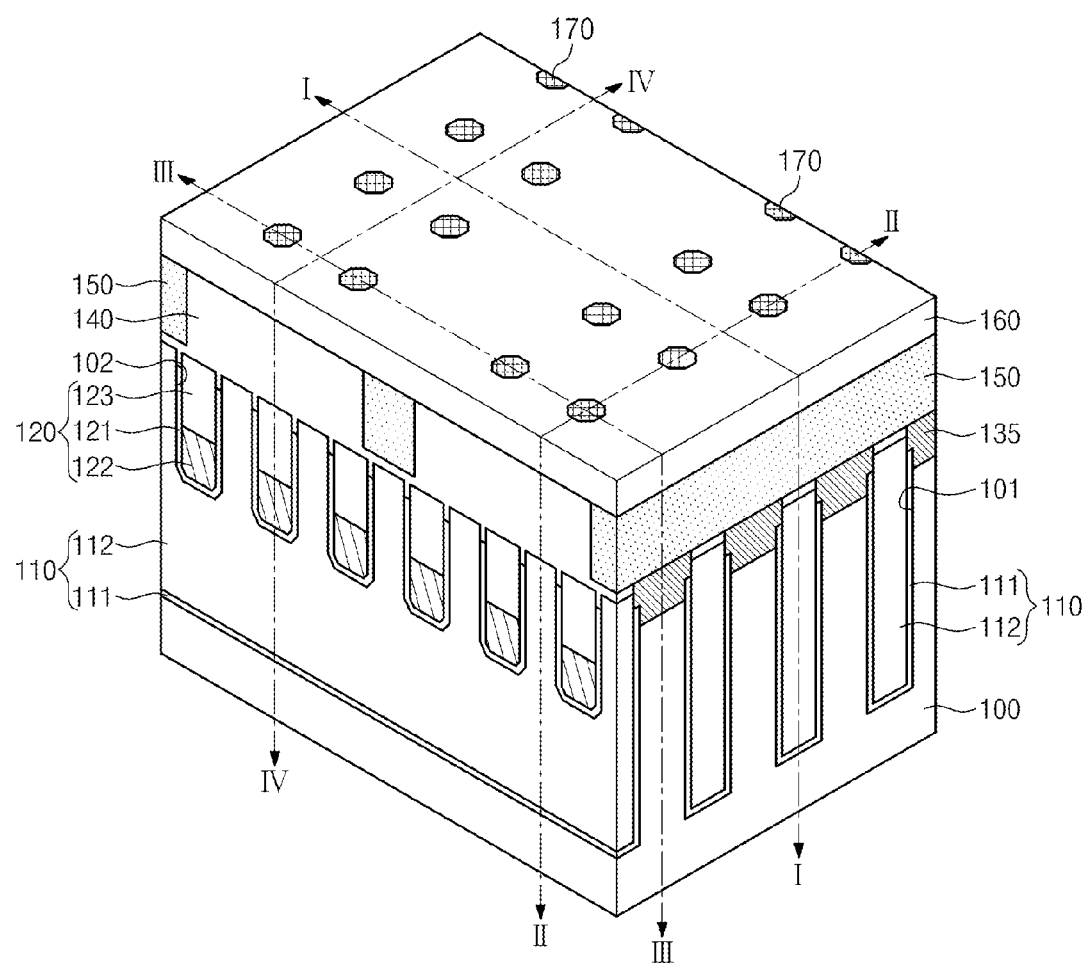
Figure 8B:
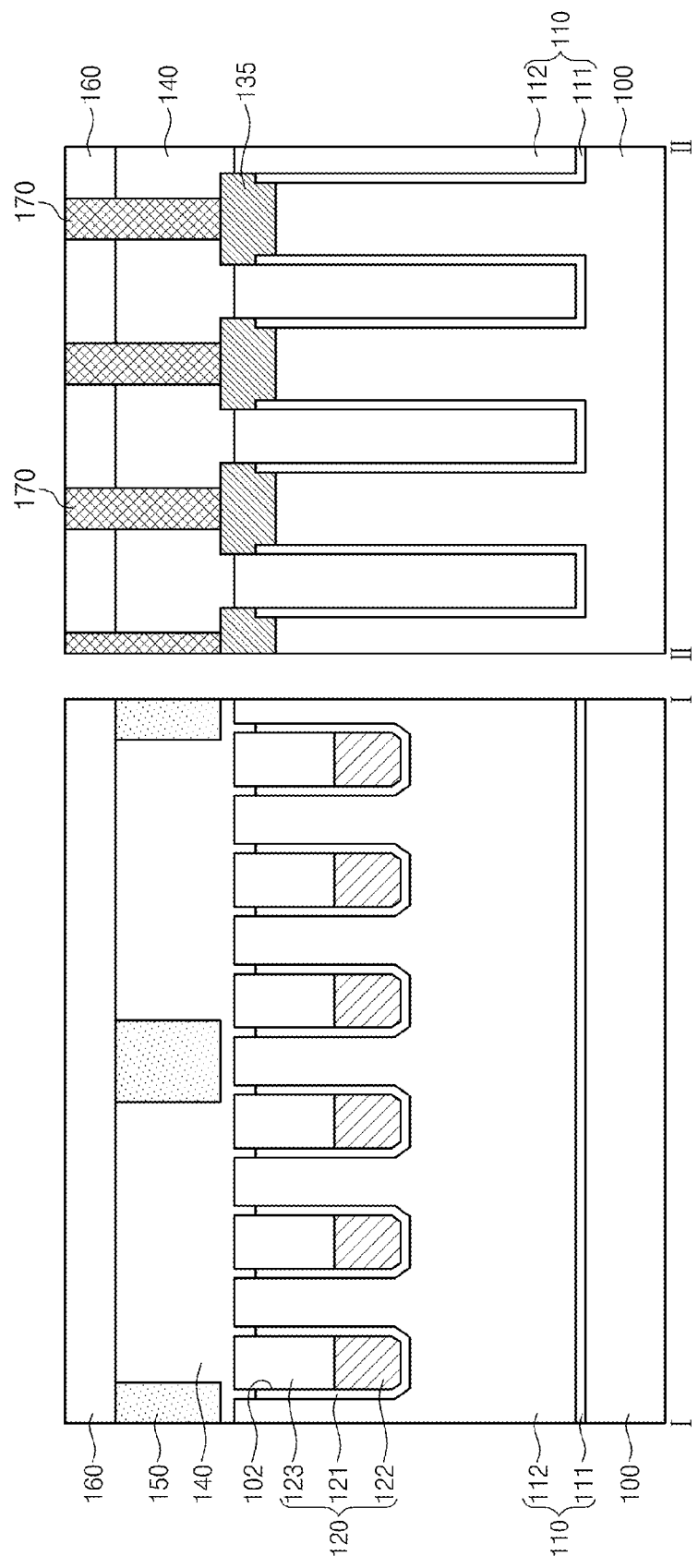
Figure 8C:
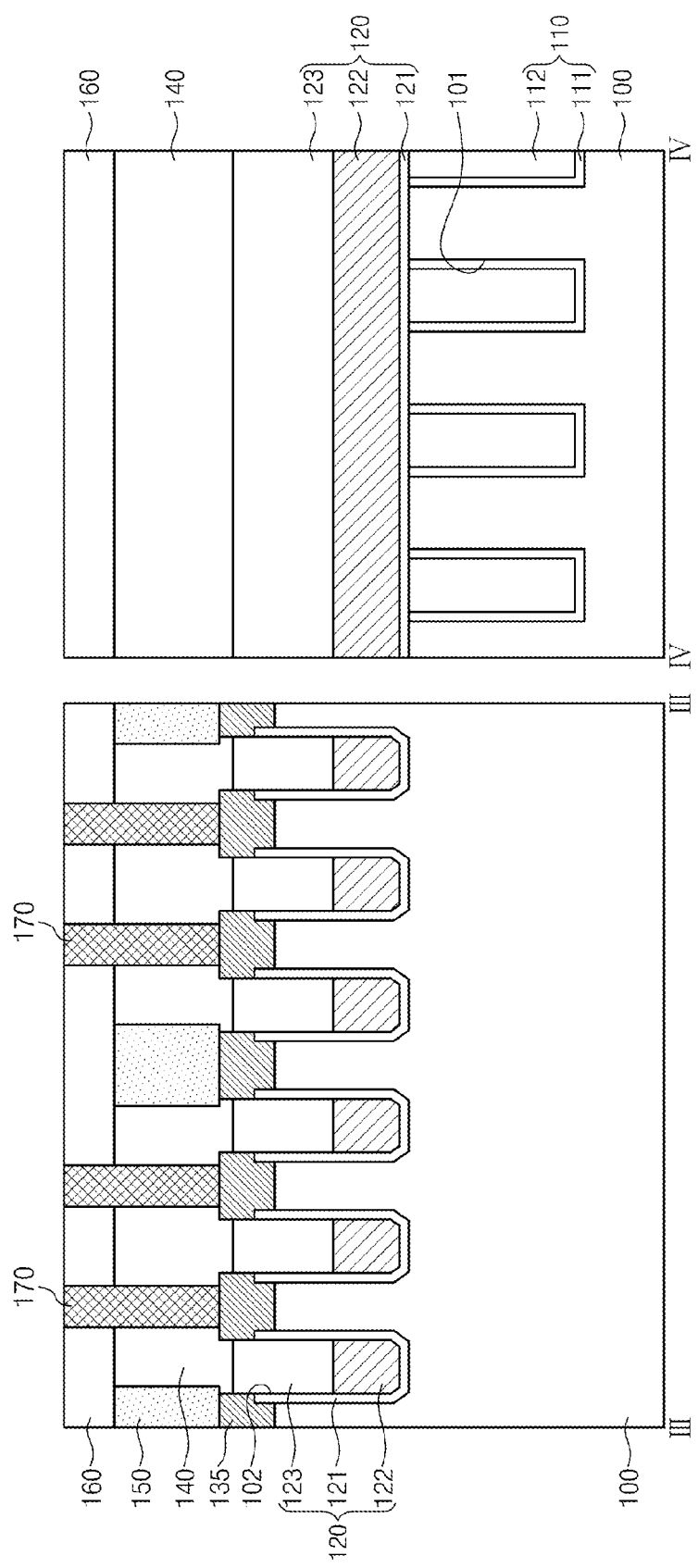

Referring to FIGS. 8A through 8C, contact plugs 170 may be formed to be coupled to the ohmic patterns 135. The formation of the contact plugs 170 may include forming a second interlayered insulating layer 160 to cover the structure provided with the source lines 150, forming contact holes penetrating (or, extending through) the second and first interlayered insulating layers 160 and 140, and then, filling the contact holes with a conductive layer.

In example embodiments, the contact plugs 170 may be connected to the ohmic patterns 135, respectively, which are not connected to the source lines 150. For example, the contact plugs 170 may be connected to the ohmic patterns 135 serving as drain electrodes of the transistors. Each of the contact plugs 170 may be a multi-layered structure including a transition metal layer and/or a transition metal nitride layer.

Figure 9A:
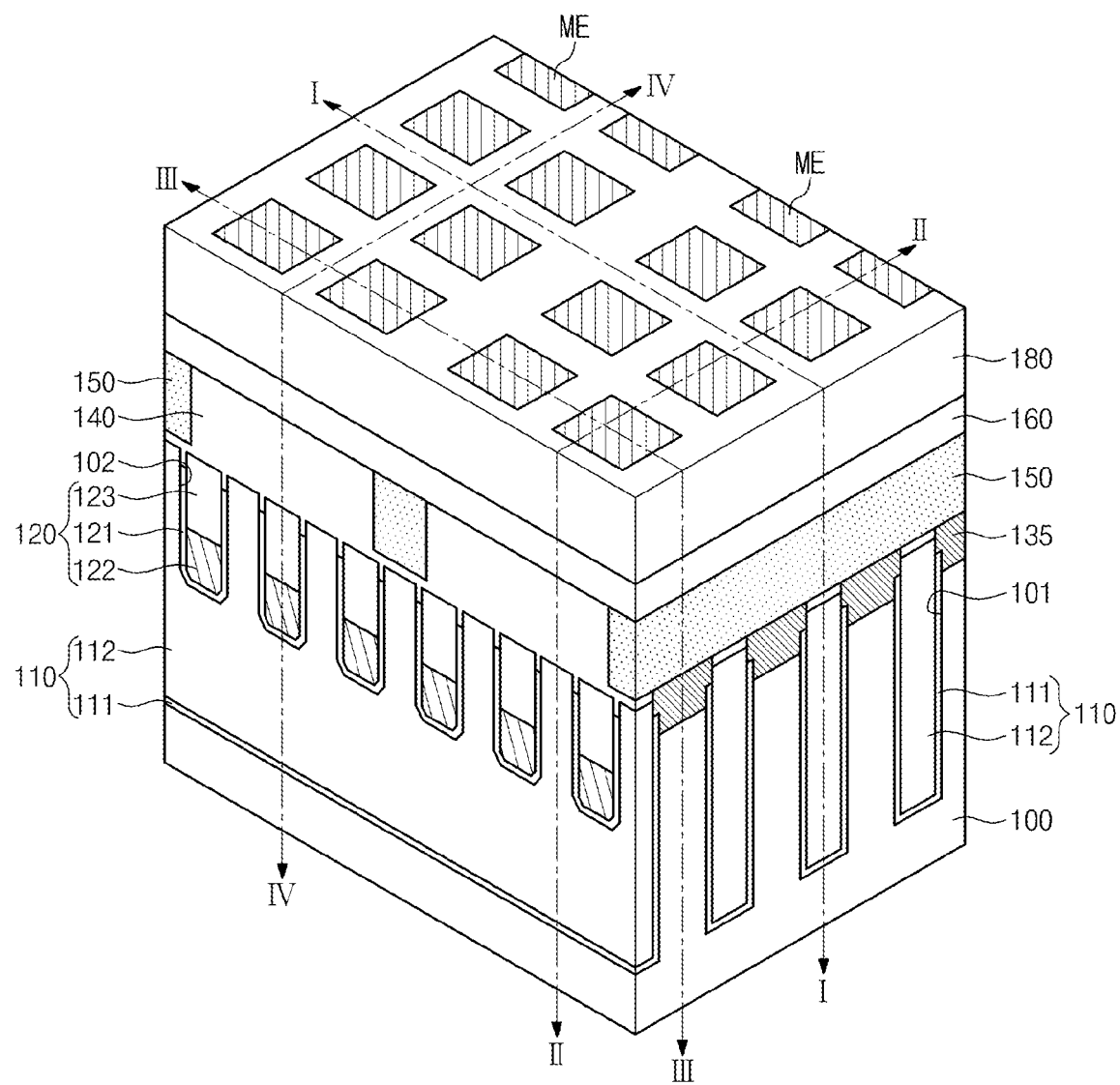
Figure 9B:
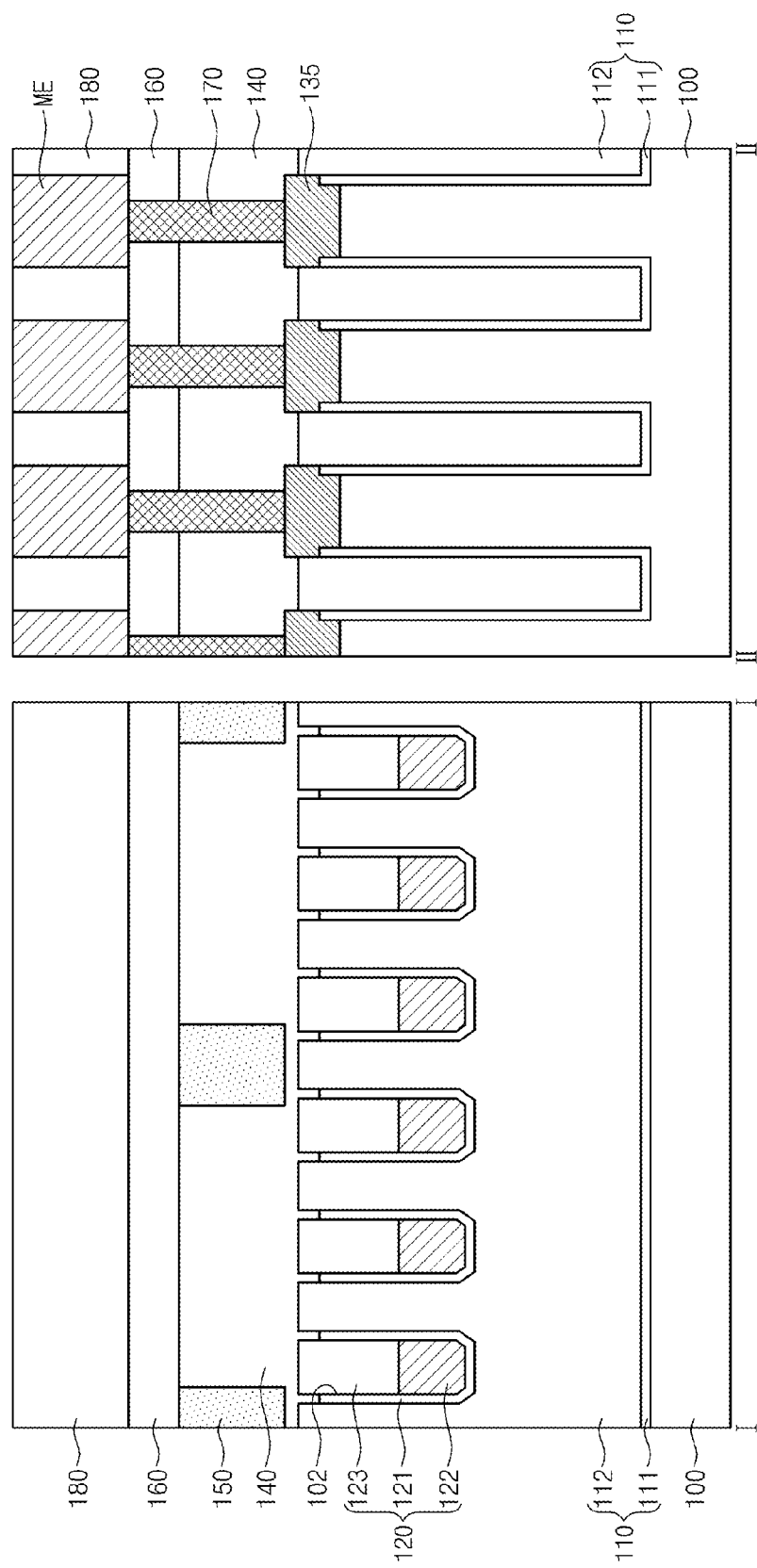
Figure 9C:
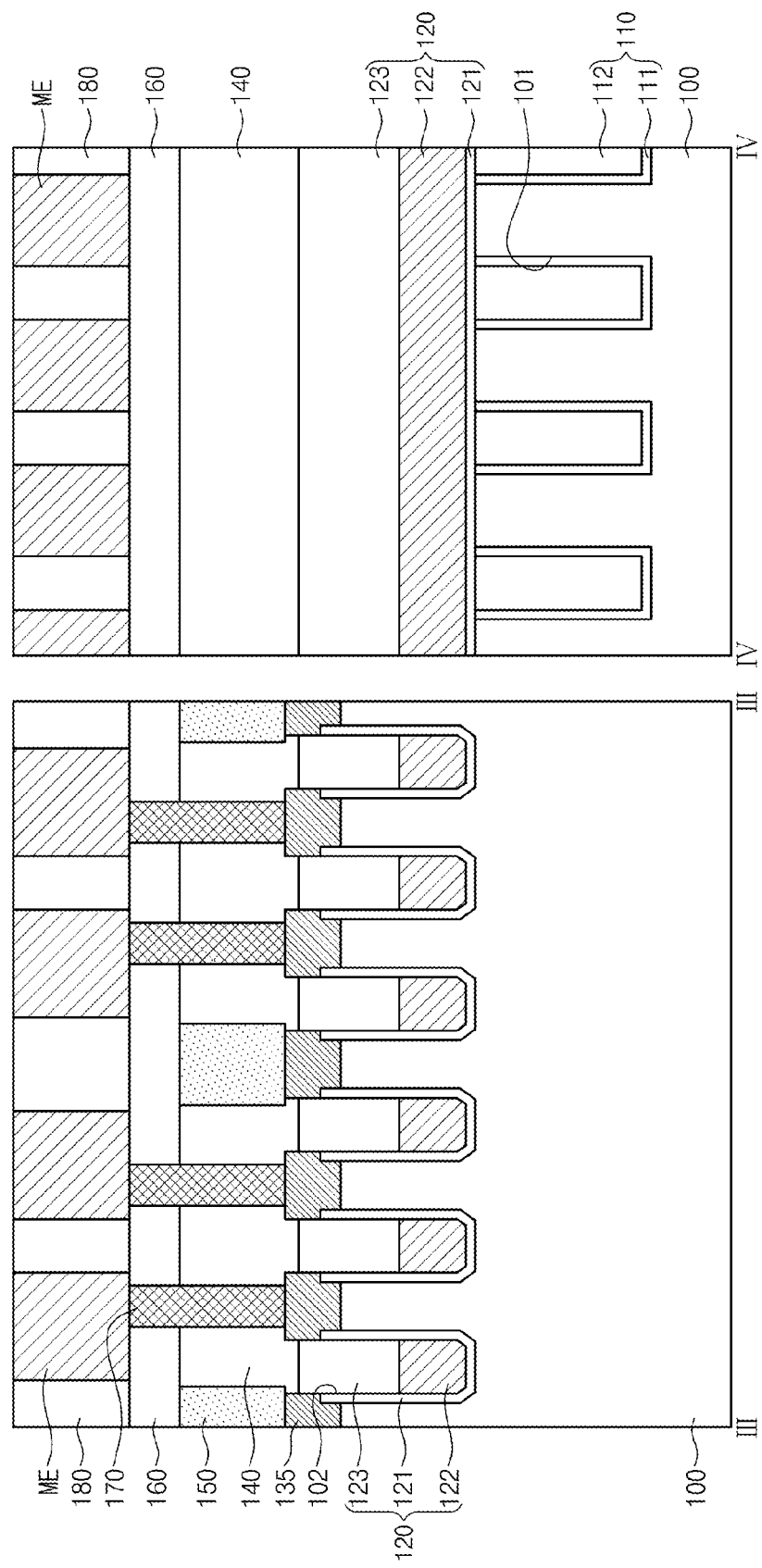

Referring to FIGS. 9A through 9C, memory elements ME may be formed to be coupled to the contact plugs 170.

In example embodiments, the memory elements ME may be formed using a damascene process. For example, the formation of the memory elements ME may include forming a third interlayered insulating layer 180 to cover the structure provided with the contact plugs 170, patterning the third interlayered insulating layer 180 to form openings exposing the contact plugs 170, respectively, and then, filling the openings with a memory layer.

In other example embodiments, the memory elements ME may be formed using a patterning process. For example, the formation of the memory elements ME may include forming a memory layer on the structure provided with the contact plugs 170 and patterning the memory layer to form the memory elements ME on the contact plugs 170, respectively. Thereafter, the memory elements ME may be covered with the third interlayered insulating layer 180.

The memory elements ME may include a material or a layered structure exhibiting a variable resistance property. The memory elements ME according to example embodiments will be exemplarily described in more detail with reference to FIGS. 13 through 16.

Figure 10A:
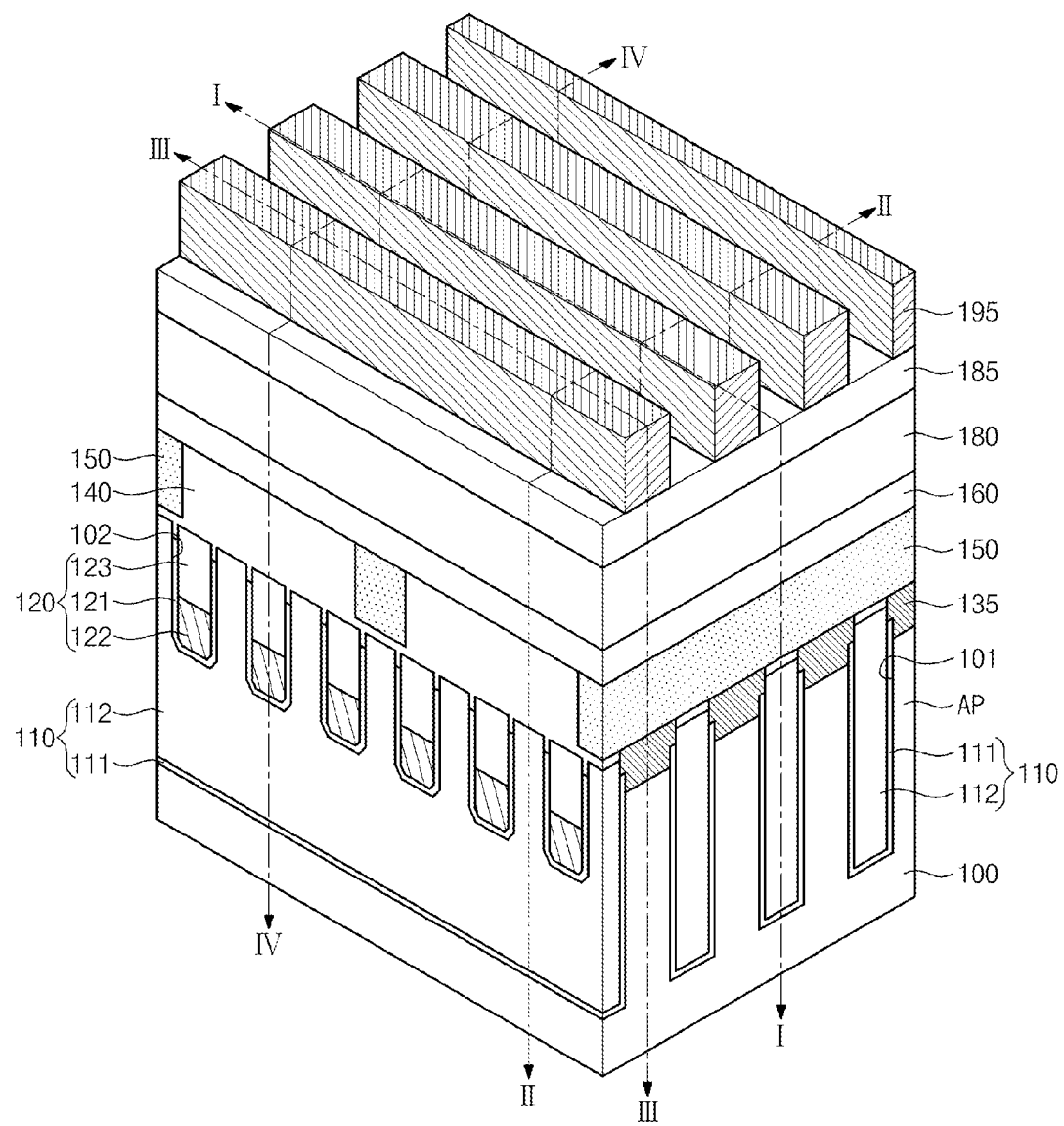
Figure 10B:
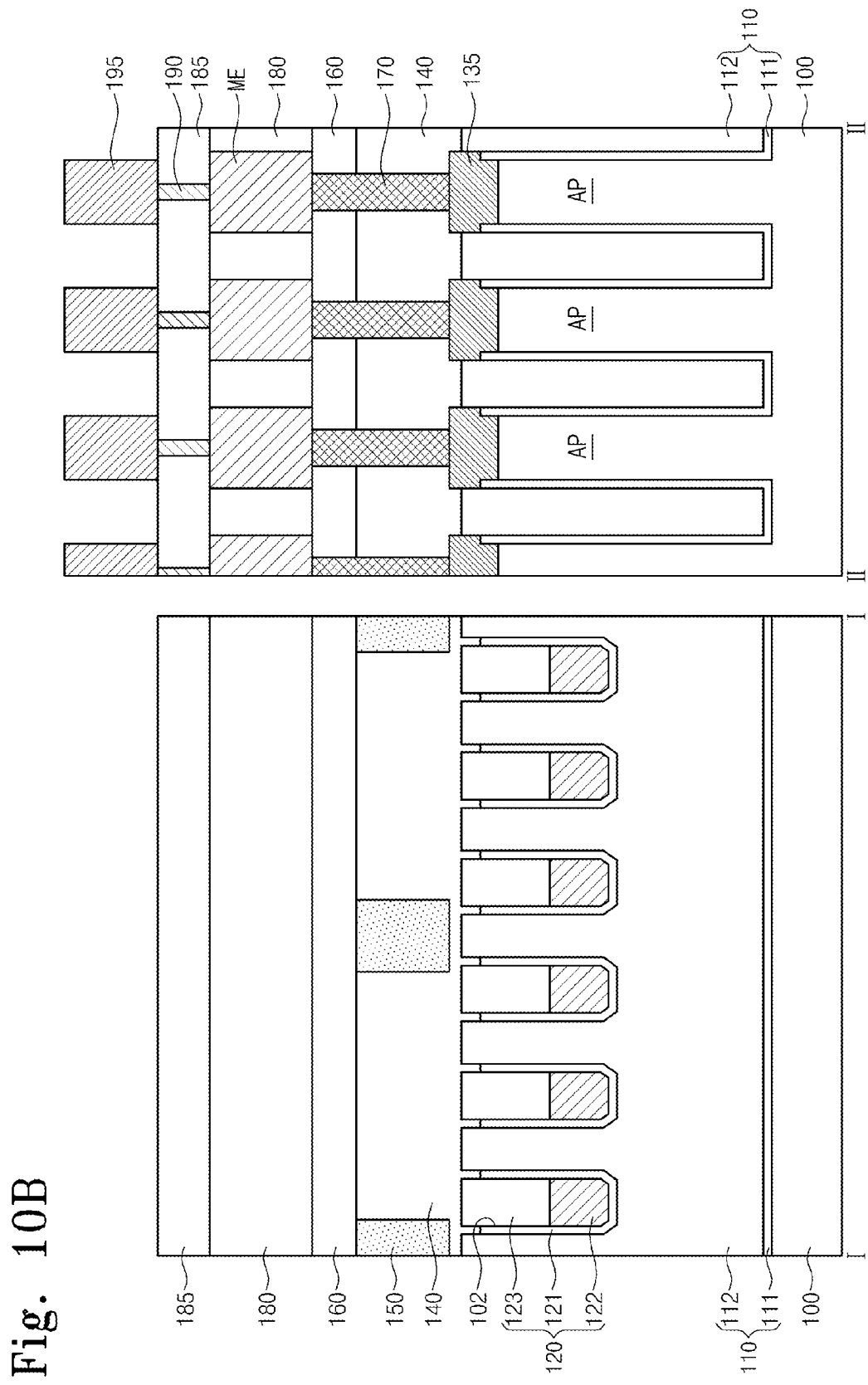
Figure 10C:
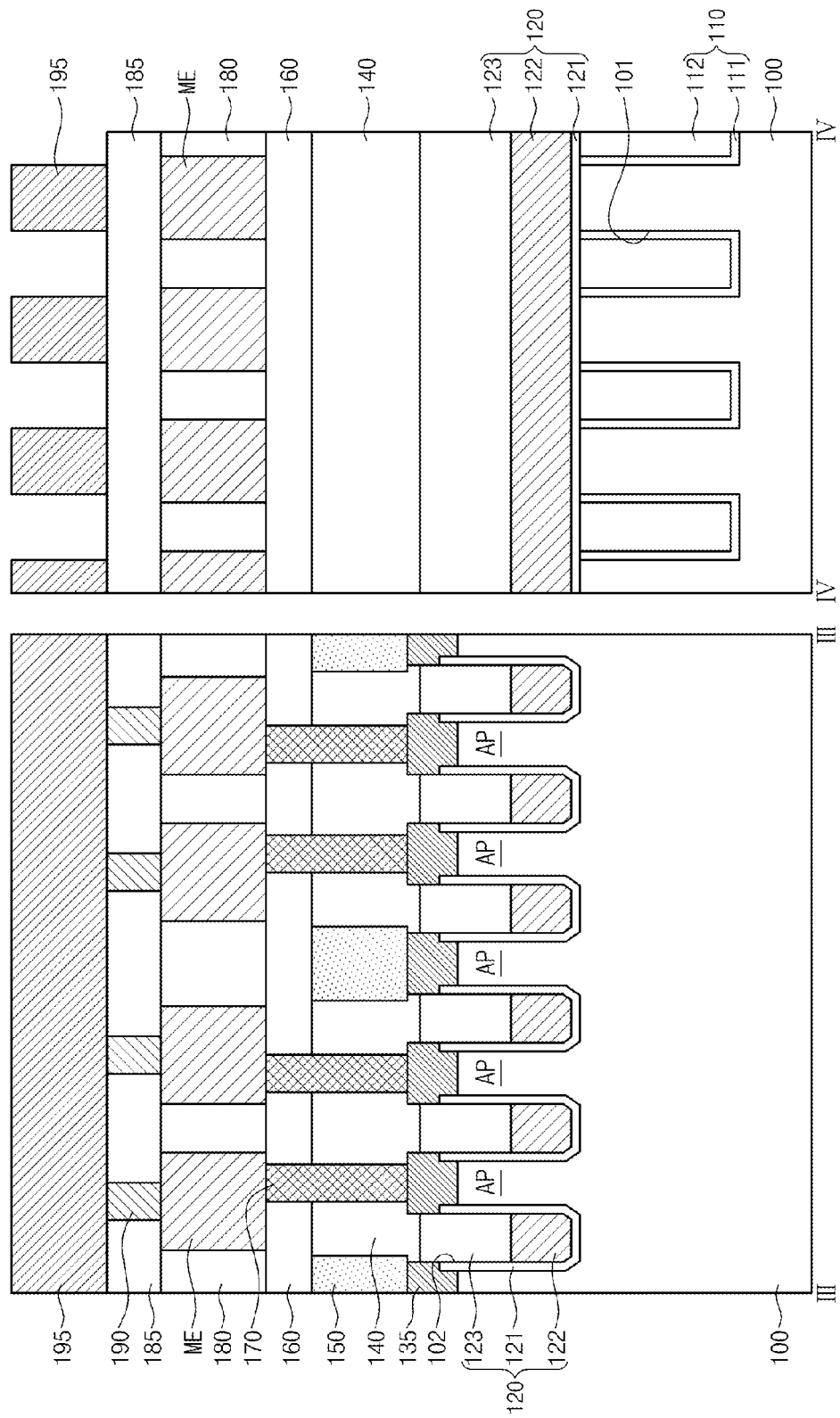

Referring to FIGS. 10A through 10C, bit lines 195 may be formed to connect the memory elements ME. In example embodiments, each of the bit lines 195 may be formed to cross the gate patterns 120 and connect plural ones of the memory elements ME disposed thereunder electrically to each other.

In example embodiments, the bit lines 195 may be connected to the memory elements ME through upper plugs 190. For example, before the formation of the bit lines 195, a fourth interlayered insulating layer 185 may be formed to cover the structure provided with the memory elements ME and be patterned to form upper contact holes, each of which exposes a top surface of a corresponding one of the memory elements ME, and then, the upper plugs 190 may be formed to fill the upper contact holes. In the case where the memory elements ME are formed using a patterning process, the formation of the fourth interlayered insulating layer 185 may be omitted and the upper plugs 190 may be formed to penetrate the third interlayered insulating layer 180.

Figure 11:
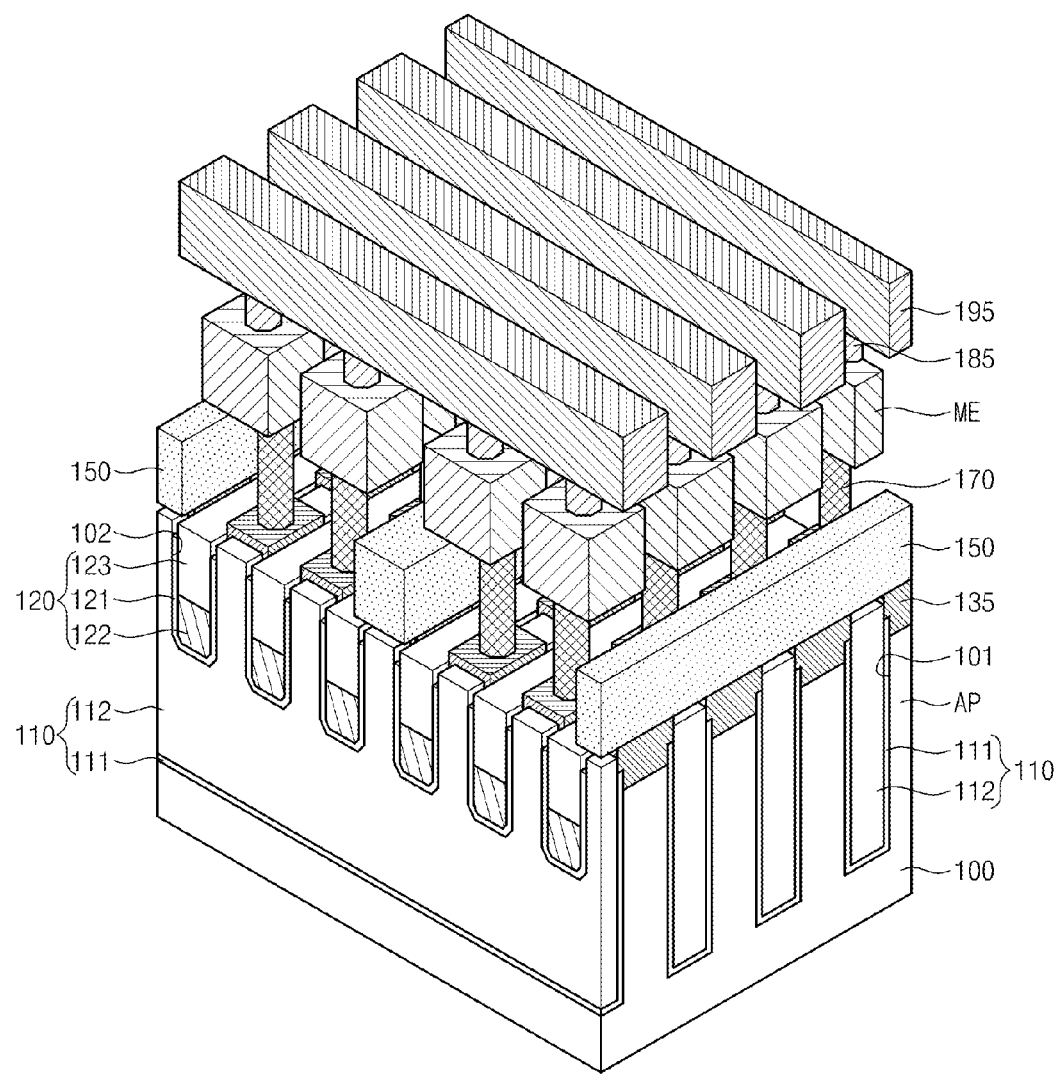
FIG. 11 is a perspective view of a semiconductor device according to example embodiments.
Figure 12:
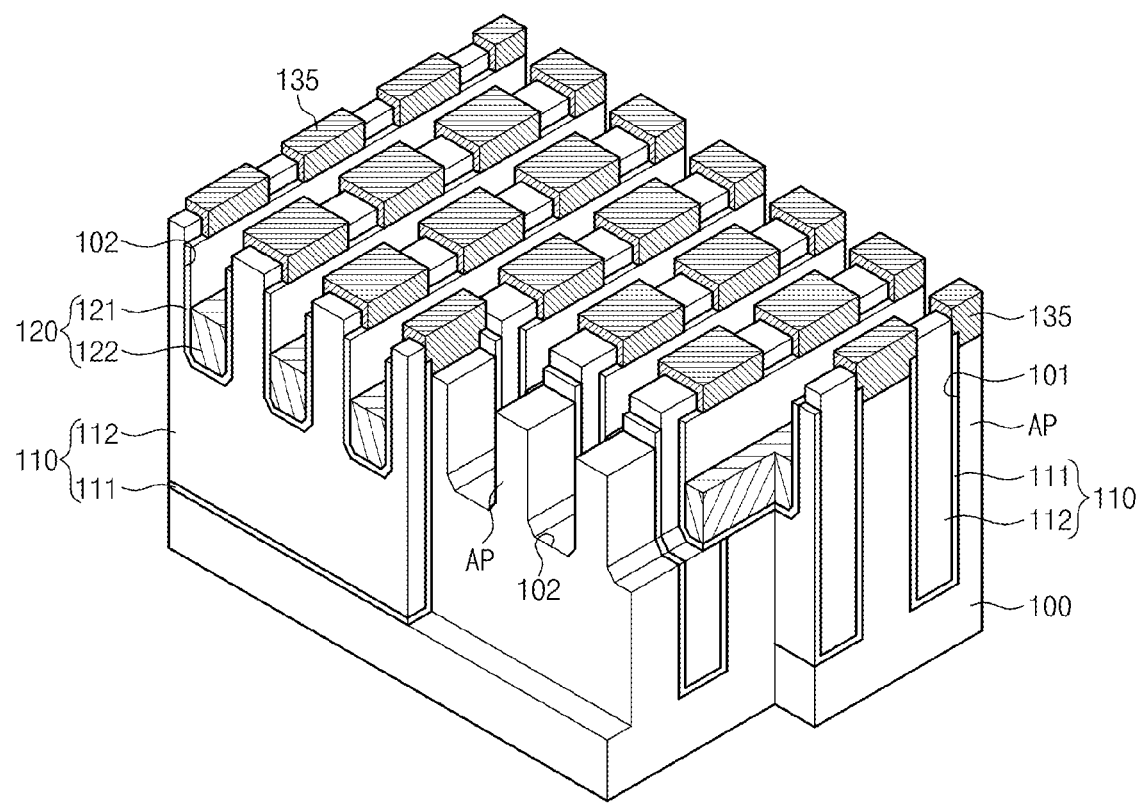
FIG. 12 is a perspective view illustrating some aspects of a semiconductor device according to example embodiments.

FIG. 11 is a perspective view of a semiconductor device according to example embodiments. FIG. 12 is a perspective view illustrating some aspects of a semiconductor device according to example embodiments.

FIGS. 11 and 12 illustrate a semiconductor device, which may be fabricated by the process described with reference to FIGS. 1A through 10A. In order to reduce complexity in the drawings and to provide better understanding of example embodiments, some elements (for example, interlayered insulating layers) of the semiconductor device may be omitted in FIGS. 11 and 12. In addition, for concise description, overlapping description of elements previously described with reference to FIGS. 1-10 may be omitted.

Referring to FIGS. 11 and 12, provided is the substrate 100 with two-dimensionally arranged active portions AP. The active portions AP may be delimited by the first and second trenches 101 and 102 crossing each other. The first trenches 101 may be formed to have a depth greater than those of the second trenches 102.

The device isolation patterns 110 may be disposed in the first trenches 101. Each of the device isolation patterns 110 may include the first device isolation pattern 111 conformally covering an inner surface of the first trench 101 and the second device isolation pattern 112 filling the first trench 101 provided with the first device isolation pattern 111. In example embodiments, the first device isolation pattern 111 may be formed of oxide (for example, silicon oxide or metal oxide), while the second device isolation pattern 112 may be formed of nitride (for example, silicon nitride or silicon oxynitride). The first device isolation pattern 111 may have a top surface that is positioned at a level lower than that of the second device isolation pattern 112. In other words, the second device isolation pattern 112 may have an upper sidewall that is not covered with the first device isolation pattern 111.

The gate patterns 120 may be disposed in the second trenches 102. The gate patterns 120 may be formed across the first trenches 101 crossing the second trenches 102. Each of the gate patterns 120 may include the gate insulating layer 121, the gate line 122 and the gate capping pattern 123. In example embodiments, the gate insulating layer 121 may be formed of oxide (for example, silicon oxide or metal oxide), while the gate capping pattern 123 may be formed of nitride (for example, silicon nitride or silicon oxynitride). The gate insulating layer 121 may have a top surface that is positioned at a level lower than that of the gate capping pattern 123. In other words, the gate capping pattern 123 may have an upper sidewall that is not covered with the gate insulating layer 121.

The ohmic patterns 135 may be provided on the active portions AP, and impurity regions (not shown) serving as source and drain electrodes of the transistors may be further formed below the ohmic patterns 135. Some of the gate lines 122 may be used as gate electrodes controlling channel potentials of the transistors, and the others may be used as isolation electrodes electrically separating the transistors from each other.

Each of the ohmic patterns 135 may include a portion that has a width greater than that of the active portion AP disposed thereunder. For example, each ohmic pattern 135 may have a portion, whose width is greater than that of a corresponding one of the active portions AP that are disposed thereunder, when measured in a direction parallel to the first and second trenches 101 and 102. In example embodiments, each of the ohmic patterns 135 may extend horizontally from the active portion AP to cover upper sidewalls of the second device isolation pattern 112 and the gate capping pattern 123 adjacent thereto. Furthermore, each of the ohmic patterns 135 may cover top surfaces of the first device isolation pattern 111 and the gate insulating layer 121 adjacent thereto. This expansion of the ohmic patterns 135 may result from the recess process described with reference to FIGS. 4A through 4C.

Each of the ohmic patterns 135 may include a bottom surface that is lower than top surfaces of the first device isolation pattern 111 and/or the gate insulating layer 121 adjacent thereto. In example embodiments, the bottom surface of the ohmic pattern 135 may be formed at a level higher than the top surface of the gate line 122.

The ohmic patterns 135 may be electrically connected to the source lines 150 or the contact plugs 170. For example, each of the source lines 150 may be formed to cross the device isolation patterns 110 and connect plural ones of the ohmic patterns 135 electrically to each other, and each of the contact plugs 170 may be electrically connected to a corresponding one of the ohmic patterns 135 that are not connected to the source lines 150. In example embodiments, two columns of the contact plugs 170 may be disposed between a pair of the source lines 150.

The memory elements ME may be provided on the contact plugs 170, respectively. Each of the memory elements ME may be electrically connected to a corresponding one of the contact plugs 170 disposed thereunder. The bit lines 195 may be provided on the memory elements ME to cross the gate patterns 120. The memory elements ME may be electrically connected to a corresponding one of the bit lines 195 via the upper plugs 190.

Memory elements according to example embodiments will be exemplarily described with reference to FIGS. 13 through 16, but example embodiments may not be limited thereto.

Figure 13:
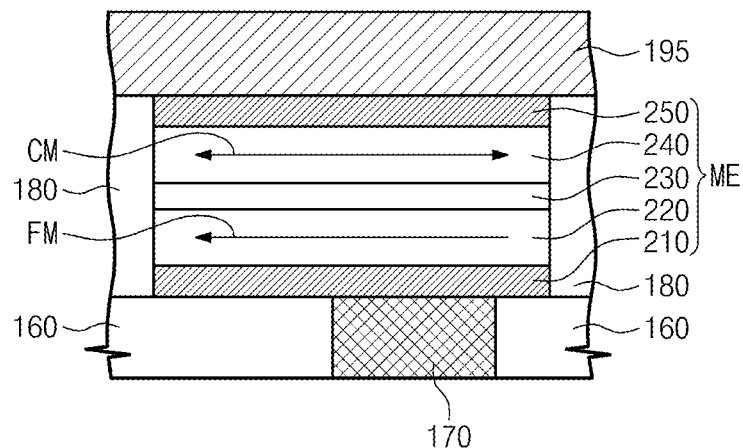
FIG. 13 is a sectional view illustrating a memory element according to example embodiments.

FIG. 13 is a sectional view illustrating a memory element according to example embodiments.

Referring to FIG. 13, the memory element ME may include a reference pattern 220, a free pattern 240, and a tunnel barrier pattern 230 disposed between the reference pattern 220 and free pattern 240. A magnetization direction FM of the reference pattern 220 may be fixed to a specific direction, while a magnetization direction CM of the free pattern 240 may be switched to be parallel or anti-parallel to the magnetization direction FM of the reference pattern 220. The magnetization directions FM and CM of the reference and free patterns 220 and 240 may be parallel to a surface of the tunnel barrier pattern 230 that is in contact with the free pattern 240. The reference pattern 220, the tunnel barrier pattern 230 and the free pattern 240 may constitute a magnetic tunnel junction.

In the case where the magnetization direction CM of the free pattern 240 is parallel to the magnetization direction FM of the reference pattern 220, the memory element ME may have a first resistance. In the case where the magnetization direction CM of the free pattern 240 is anti-parallel to the magnetization direction FM of the reference pattern 220, the memory element ME may have a second resistance that is greater than the first resistance. This difference between the first and second resistances may be used as binary data in the memory element ME. In example embodiments, the magnetization direction CM of the free pattern 240 may be switched using a spin-torque transfer technique.

Each of the reference and free patterns 220 and 240 may include a ferromagnetic material. The reference pattern 220 may further include an antiferromagnetic material pinning a magnetization direction of the ferromagnetic material therein. The tunnel barrier pattern 230 may include at least one of magnesium oxide, titanium oxide, aluminum oxide, magnesium-zinc oxide, and/or magnesium-boron oxide.

The memory element ME may further include a lower electrode 210 and an upper electrode 250. The reference pattern 220, the tunnel barrier pattern 230, and the free pattern 240 may be interposed between the lower electrode 210 and the upper electrode 250. As shown, the reference pattern 220, the tunnel barrier pattern 230 and the free pattern 240 may be sequentially stacked on the lower electrode 210, and the upper electrode 250 may be provided on the free pattern 240. Alternatively, the free pattern 240, the tunnel barrier pattern 230, and the reference pattern 220 may be sequentially stacked on the lower electrode 210. In this case, the upper electrode 250 may be provided on the reference pattern 220. The lower electrode 210 and the upper electrode 250 may include a conductive metal nitride (e.g., of titanium nitride, tantalum nitride, and/or tungsten nitride).

Figure 14:
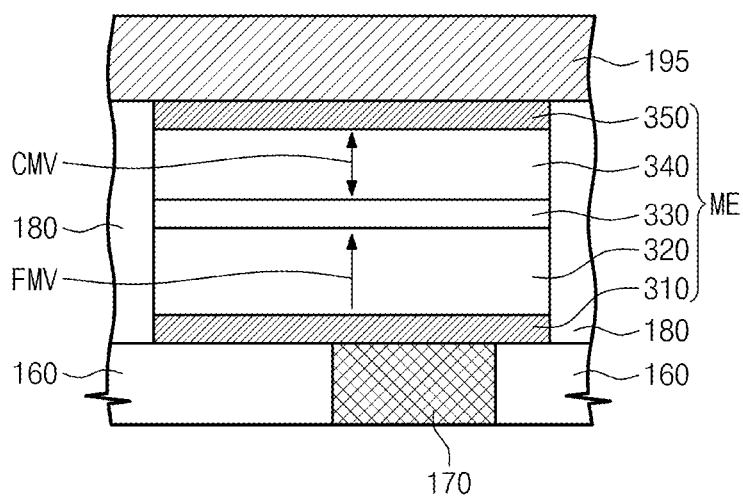
FIG. 14 is a sectional view illustrating a memory element according to other example embodiments.

FIG. 14 is a sectional view illustrating a memory element according to other example embodiments.

Referring to FIG. 14, in the present example embodiments, the memory element ME may include a reference perpendicular pattern 320, a free perpendicular pattern 340, and a tunnel barrier pattern 330 interposed between the reference perpendicular pattern 320 and the free perpendicular pattern 340. A magnetization direction FMV of the reference perpendicular pattern 320 may be fixed to a specific direction, while a magnetization direction CMV of the free perpendicular pattern 340 may be switched to be parallel or anti-parallel to the magnetization direction FMV of the reference perpendicular pattern 320. Here, the magnetization directions FMV and CMV of the reference and free perpendicular patterns 320 and 340 may be perpendicular to a surface of the tunnel barrier pattern 330 that is in contact with the free perpendicular pattern 340.

The reference and free perpendicular patterns 320 and 340 may include at least one of perpendicular magnetic material (e.g., CoFeTb, CoFeGd, and/or CoFeDy), a perpendicular magnetic material having an $L1_0$ structure, CoPt of a hexagonal close packed (HCP) lattice structure, and perpendicular magnetic structures. The perpendicular magnetic material having the $L1_0$ structure may include at least one of $L1_0$ FePt, $L1_0$ FePd, $L1_0$ CoPd, and/or $L1_0$ CoPt. The perpendicular magnetic structures may include magnetic layers and non-magnetic layers which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n (where the n is the number of alternately stacked magnetic layers and the non-magnetic layers). In example embodiments, the reference perpendicular pattern 320 may be thicker than the free perpendicular pattern 340, and/or a coercive force of the reference perpendicular pattern 320 may be greater than that of the free perpendicular pattern 340.

The tunnel barrier pattern 330 may include at least one of magnesium oxide, titanium oxide, aluminum oxide, magnesium-zinc oxide, or magnesium-boron oxide. The memory element ME may further include a lower electrode 310 and an upper electrode 350. As shown, the reference perpendicular pattern 320, the tunnel barrier pattern 330 and the free perpendicular pattern 340 may be sequentially stacked on the lower electrode 310, and the upper electrode 350 may be provided on the free perpendicular pattern 340. Alternatively, the free perpendicular pattern 340, the tunnel barrier pattern 330 and the reference perpendicular pattern 320 may be sequentially stacked on the lower electrode 310, and the upper electrode 350 may be provided on the reference perpendicular pattern 320. The lower and upper electrodes 310 and 350 may include a conductive metal nitride layer.

Figure 15:
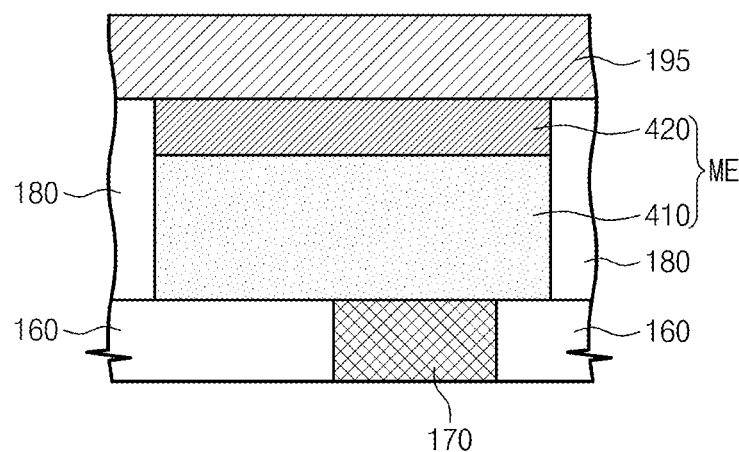
FIG. 15 is a sectional view illustrating a memory element according to still other example embodiments.

FIG. 15 is a sectional view illustrating a memory element according to still other example embodiments.

Referring to FIG. 15, in the present example embodiments, the memory element ME may include a phase-change material pattern 410 and a capping electrode 420 that are sequentially stacked. A phase of the phase-change material pattern 410 may be switched into a crystalline state or an amorphous state by controlling a temperature thereof and/or a cooling time thereof. The phase-change material pattern 410 may exhibit a lower resistance in the crystalline state than in the amorphous state. This difference in electric resistance between the crystalline and amorphous states may be used as binary data in the memory element ME. In example embodiments, the contact plug 170 being in contact with the phase-change material pattern 410 may serve as a heater electrode. In this case, a portion of the phase-change material pattern 410 adjacent to the contact plug 170 may be used as a program region, whose crystal structure may be changed into a crystalline state or an amorphous state.

The phase-change material pattern 410 may include at least one of chalcogenide elements such as tellurium (Te) and selenium (Se). For example, the phase-change material pattern 410 may include at least one of Ge—Sb—Te compounds, As—Sb—Te compounds, As—Ge—Sb—Te compounds, Sn—Sb—Te compounds, Ag—In—Sb—Te compounds, In—Sb—Te compounds, group-5A element-Sb-Te compounds, group-6A element-Sb-Te compounds, group-5A element-Sb—Se compounds, group-6A element-Sb—Se compounds, Ge—Sb compounds, In—Sb compounds, Ga—Sb compounds, and doped Ge—Sb—Te compounds. Here, the doped Ge—Sb—Te compound material may be doped with at least one of carbon (C), nitrogen (N), boron (B), bismuth (Bi), silicon (Si), phosphorus (P), aluminum (Al), dysprosium (Dy), or titanium (Ti). The capping electrode 420 may be formed of a conductive metal nitride.

Figure 16:
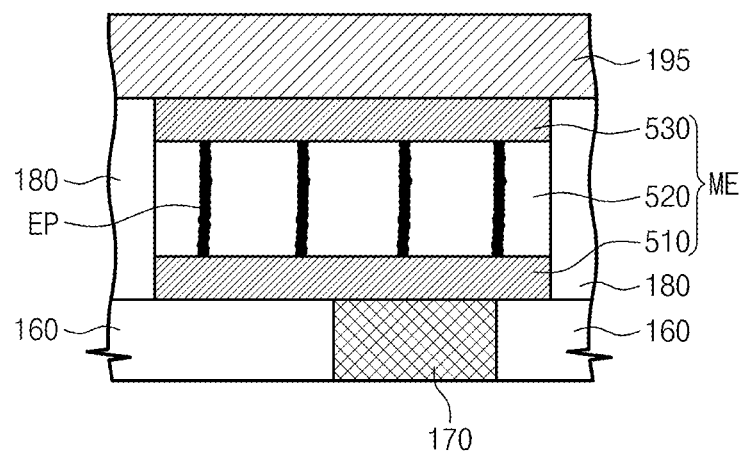
FIG. 16 is a sectional view illustrating a memory element according to even other example embodiments.

FIG. 16 is a sectional view illustrating a memory element according to even other example embodiments.

Referring to FIG. 16, in the present example embodiments, the memory element ME may include a lower electrode 510, an upper electrode 530 and a transition metal oxide pattern 520 interposed between the lower and upper electrodes 510 and 530. At least one electrical pathway EP may be generated in or disappear from the transition metal oxide pattern 520 by a programming operation. Both end portions of the electrical pathway EP may be connected to the lower and upper electrodes 510 and 530, respectively. The memory element ME may exhibit a low resistance for the presence of the electrical pathway EP and a high resistance for the absence of the electrical pathway EP. This difference in resistance between the presence and absence of the electrical pathway EP may be used as binary data in the memory element ME.

The transition metal oxide pattern 520 may include at least one of, for example, niobium oxide, titanium oxide, nickel oxide, zirconium oxide, vanadium oxide, PCMO ((Pr,Ca)MnO$_3$), strontium-titanium oxide, barium-strontium-titanium oxide, strontium-zirconium oxide, barium-zirconium oxide, or barium-strontium-zirconium oxide.

The lower and upper electrodes 510 and 530 may include at least one of conductive metal nitrides (e.g., titanium nitride or tantalum nitride), transition metals (e.g., titanium or tantalum), and rare-earth metals (e.g., ruthenium or platinum).

Figure 17:
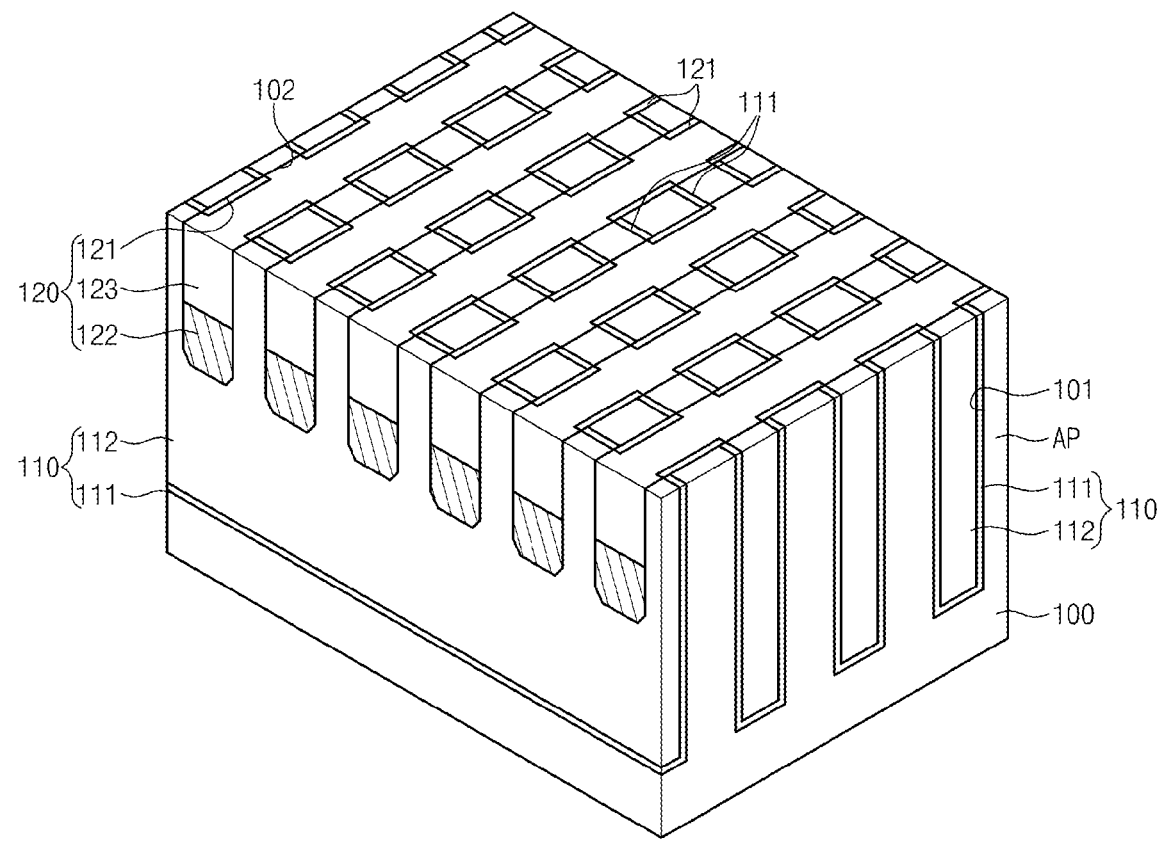
FIG. 17 is a perspective view illustrating some features of a semiconductor device according to modified example embodiments.

FIG. 17 is a perspective view illustrating some features of a semiconductor device according to modified example embodiments.

In the formation of the gate patterns 120 described with reference to FIGS. 3A through 3C, the gate insulating layer 121 may be a silicon oxide layer that is formed by a thermal oxidation process. In this case, as shown in FIG. 17, the gate insulating layer 121 may be locally formed on surfaces of the active portions AP exposed by the second trenches 102, and the gate lines 122 and the gate capping patterns 123 may be formed to be in direct contact with the device isolation pattern 110. Alternatively, there may be a difference in thickness of the gate insulating layer 121 between on surfaces of the active portions AP and on surfaces of the device isolation patterns 110.

Figure 18:
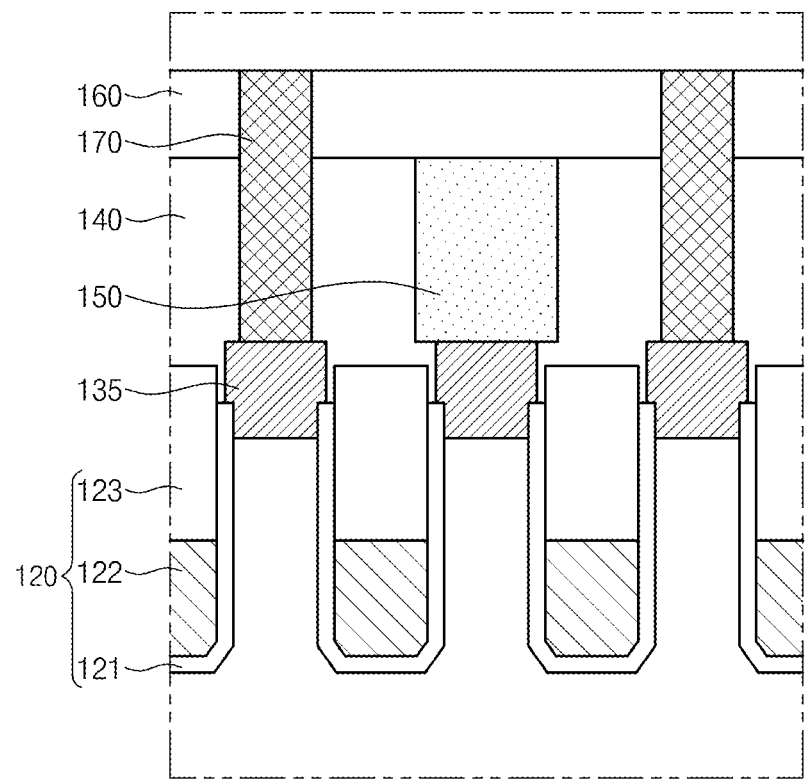
FIG. 18 is a sectional view a semiconductor device according to other modified example embodiments and a method of fabricating the same.

FIG. 18 is a sectional view a semiconductor device according to other modified example embodiments and a method of fabricating the same.

In the formation of the ohmic patterns 135 described with reference to FIGS. 6A through 6C, as shown in FIG. 18, each of the ohmic patterns 135 may include a portion that has a width greater than the active portion AP disposed thereunder and is spaced apart from the second device isolation pattern 112 and the gate capping pattern 123. For example, each of the ohmic patterns 135 may extend horizontally from the top surface of the active portion AP. This expansion of the ohmic patterns 135 may result from the recess process described with reference to FIGS. 4A through 4C.

The semiconductor devices disclosed above may be encapsulated using various and diverse packaging techniques. For example, the semiconductor devices according to the aforementioned example embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi-chip package (MCP) technique, a wafer-level fabricated package (WFP) technique and a wafer-level processed stack package (WSP) technique.

The package in which the semiconductor device according to one of the above example embodiments is mounted may further include at least one semiconductor device (e.g., a controller and/or a logic device) that controls the semiconductor device.

Figure 19:
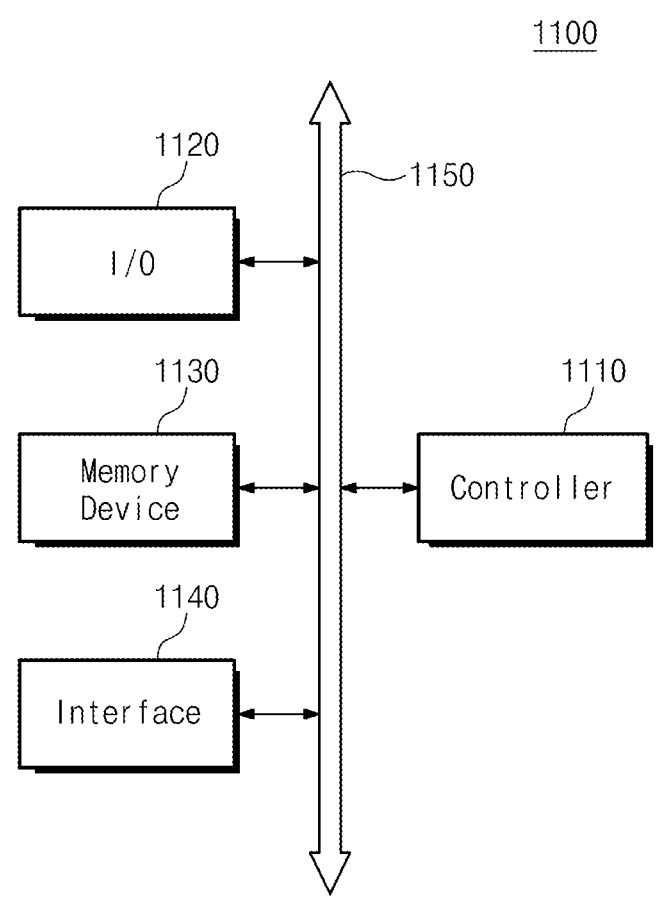
FIG. 19 is a schematic block diagram illustrating an example of electronic systems including semiconductor memory devices according to example embodiments.

FIG. 19 is a schematic block diagram illustrating an example of electronic systems including semiconductor memory devices according to example embodiments.

Referring to FIG. 19, an electronic system 1100 according to example embodiments may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include, e.g., at least one of a microprocessor, a digital signal processor, a microcontroller, or another logic device. The other logic device may have a similar function to any one of the microprocessor, the digital signal processor, and the microcontroller. The I/O unit 1120 may include, e.g., a keypad, a keyboard, and/or a display unit. The memory device 1130 may store data and/or commands. The memory device 1130 may include at least one of the semiconductor memory devices according to the example embodiments described above. The memory device 1130 may further include other type of semiconductor memory devices, which are different from the semiconductor devices described above. For example, the memory device 1130 may further include a non-volatile memory device (e.g., a flash memory device, a magnetic memory device, a phase change memory device, and so forth), a dynamic random access memory (DRAM), and/or a static random access memory (SRAM) device. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication.

Although not shown in the drawings, the electronic system 1100 may further include a fast DRAM device and/or a fast SRAM device which acts as a cache memory for improving an operation of the controller 1110.

The electronic system 1100 may be applied to, e.g., a personal digital assistant (PDA), a portable computer, a web tablet, a wireless phone, a mobile phone, a digital music player, a memory card, or other electronic products. The other electronic products may receive or transmit information data by wireless.

Figure 20:
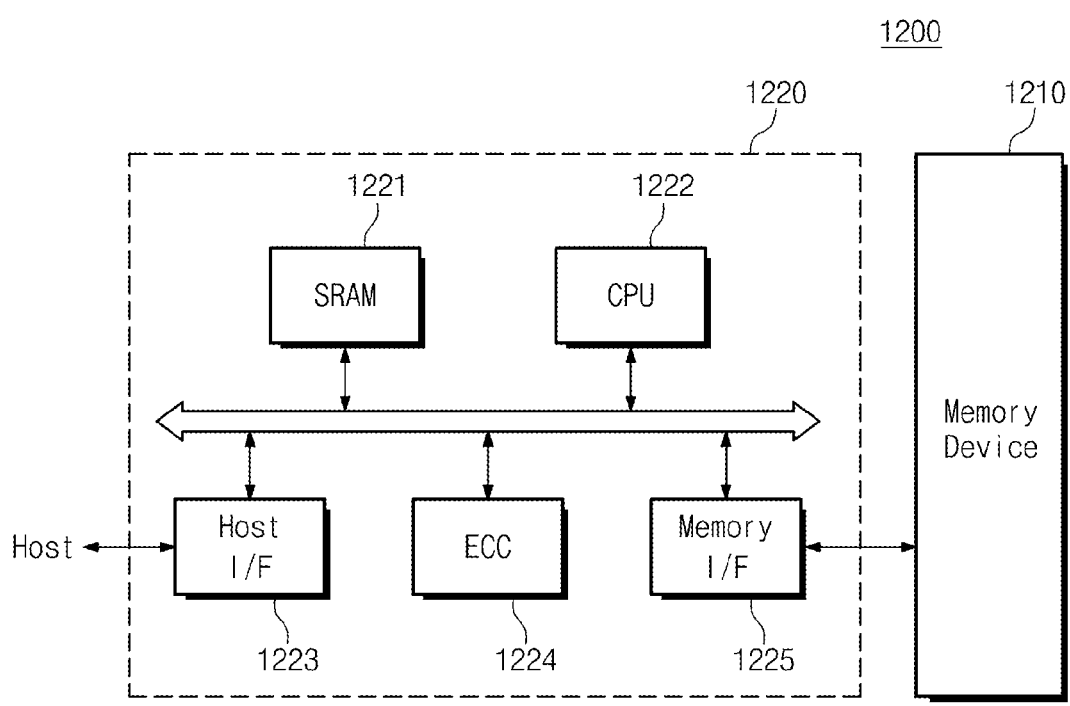
FIG. 20 is a schematic block diagram illustrating an example of memory cards including semiconductor memory devices according to example embodiments.

FIG. 20 is a schematic block diagram illustrating an example of memory cards including semiconductor memory devices according to example embodiments.

Referring to FIG. 20, a memory card 1200 according to example embodiments may include a memory device 1210. The memory device 1210 may include at least one of the semiconductor memory devices according to the example embodiments mentioned above. In other example embodiments, the memory device 1210 may further include other types of semiconductor memory devices, which are different from the semiconductor devices according to the example embodiments described above. For example, the memory device 1210 may further include a non-volatile memory device (e.g., a flash memory device, a magnetic memory device, a phase change memory device, and so forth), a dynamic random access memory (DRAM), and/or a static random access memory (SRAM) device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include a SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may be realized as solid state disks (SSD) which are used as hard disks of computer systems.

According to example embodiments, recess regions may be formed to expose upper sidewalls of active portions. Due to the presence of the recess regions, a metal layer can be in contact with the active portion with an increased contact area. This enables to increase a thickness of an ohmic pattern to be formed on the active portion. Even if a metal layer to be deposited has a small thickness, the ohmic pattern can be formed to a desired thickness. Accordingly, it is possible to reduce a contact resistance between the active pattern and the metal pattern provided thereon. Furthermore, in the case where the metal layer is deposited to a reduced thickness, it is possible to prevent the active pattern from making an electric short circuit with the metal pattern.

While example embodiments have been particularly shown and described, it will be understood by one of ordinary skill in the art that variations in form and detail may be made therein without departing from the spirit and scope of the attached claims.

What is claimed is:

1. A semiconductor device, comprising:
a substrate including a plurality of active portions delimited by a plurality of first trenches and a plurality of second trenches;
a plurality of device isolation patterns in the plurality of first trenches and extending along sidewalls of the plurality of active portions;
a plurality of gate patterns in the plurality of second trenches and extending along sidewalls of the plurality of active portions and across the plurality of device isolation patterns;
a plurality of ohmic patterns on the plurality of active portions, respectively; and
a plurality of metal patterns coupled to the plurality of ohmic patterns,
wherein each of the plurality of ohmic patterns has a portion having a width greater than a width of a corresponding one of the plurality active portions thereunder, when measured in a direction parallel to the plurality of first and second trenches.

2. The device of claim 1, wherein each of the plurality of device isolation patterns includes a first device isolation pattern and a second device isolation pattern sequentially stacked on an inner surface of a corresponding one of the plurality of first trenches, and
the first device isolation pattern has a top surface lower than a top surface of the second device isolation pattern, thereby exposing an upper side surface of the second device isolation pattern.

3. The device of claim 2, wherein the plurality of ohmic patterns are in contact with at least one of the top surface of the first device isolation pattern or the exposed upper side surface of the second device isolation pattern.

4. The device of claim 1, wherein each of the plurality of gate patterns includes,
a gate insulating layer covering an inner surface of a corresponding one of the plurality of the second trenches;
a gate line filling a lower region of the corresponding one of the second trenches covered by the gate insulating layer; and
a gate capping pattern filling an upper region of the corresponding one of the second trenches covered by the gate insulating layer,
wherein the gate insulating layer has a top surface lower than a top surface of the gate capping pattern, thereby exposing an upper side surface of the gate capping pattern.

5. The device of claim 4, wherein the gate insulating layer is within a localized region between facing surfaces of the substrate and the gate line, and
the gate line is in contact with the plurality of device isolation patterns.

6. The device of claim 4, wherein the plurality of ohmic patterns are in contact with at least one of the top surface of the gate insulating layer or the exposed upper side surface of the gate capping pattern.

7. The device of claim 4, wherein a bottom surface of the plurality of ohmic patterns are lower than the top surface of the gate insulating layer.

8. The device of claim 1, wherein each of the plurality of device isolation patterns and each of the plurality of gate patterns include,
a first insulating layer in contact with the corresponding one of the plurality of active portions, the first insulating layer being made of one selected from silicon oxide and metal oxides; and
a second insulating layer spaced apart from the corresponding one of the plurality of active portions, the second insulating layer being made of one of silicon nitride and silicon oxynitride,
wherein the first insulating layer has a top surface lower than a top surface of the second insulating layer, and
a corresponding one of the ohmic patterns include an extending portion on the first insulating layer.

9. A semiconductor device, comprising:
a substrate including a plurality of two-dimensionally arranged active portions;
a plurality of device isolation patterns extending along sidewalls of the plurality of two-dimensionally arranged active portions, each of the plurality of device isolation patterns including a first device isolation pattern and a second device isolation pattern;
a plurality of gate patterns extending along sidewalls of the plurality of two-dimensionally arranged active portions and across the plurality of device isolation patterns, each of the plurality of gate patterns including a gate insulating layer, a gate line and a gate capping pattern; and
a plurality of ohmic patterns on the plurality of two-dimensionally arranged active portions, respectively,
wherein a top surface of the first device isolation pattern and a top surface of the gate insulating layer are lower than a top surface of the second device isolation pattern and a top surface of the gate capping pattern, respectively, and
a corresponding one of the ohmic patterns include an extending portion on the first device isolation pattern.

10. The device of claim 9, wherein the first device isolation pattern is formed of silicon oxide,
the gate insulating layer is formed of one selected from silicon oxide and metal oxides,
the second device isolation pattern is formed of one selected from silicon nitride and silicon oxynitride, and
the gate capping pattern is formed of one selected from silicon nitride and silicon oxynitride.

11. The device of claim 9, wherein a bottom surface of each of the plurality of ohmic patterns is lower than the top surface of the gate insulating layer.

12. The device of claim 9, wherein the gate insulating layer is formed within a localized region between facing surfaces of the substrate and the gate line, and
the gate line is in contact with the plurality of device isolation patterns.

13. A semiconductor device, comprising:
at least two active regions protruding from an upper surface of a substrate, the at least two active regions being spaced apart from each other by a first trench;
a device isolation pattern partially filling the first trench and having a plurality of protrusions extending parallel to the at least two active regions, wherein the plurality of protrusions are spaced apart from each other by a second trench traversing the first trench;
a gate pattern in the second trench and extending over the at least two active regions, wherein the plurality of protrusions each have an upper portion spaced apart from the at least two active regions and exposed by the gate pattern; and
a plurality of ohmic patterns each contacting an upper surface of a corresponding one of the at least two active regions.

14. The semiconductor device of claim 13, wherein the plurality of ohmic patterns each have an upper portion having a width larger than a width of a lower portion of the plurality of ohmic patterns.

15. The semiconductor device of claim 14, wherein the upper portion of the plurality of ohmic patterns contacts a sidewall of the upper portion of the plurality of protrusions.

16. The semiconductor device of claim 13, wherein the plurality of ohmic patterns are formed of a transition metal silicide selected from cobalt silicide, nickel silicide and titanium silicide.

17. The semiconductor device of claim 13, wherein the first trench is entirely filled in, collectively, by the device isolation pattern and a corresponding one of the plurality of ohmic patterns.

* * * * *